(12) United States Patent
An et al.

(10) Patent No.: US 12,127,456 B2
(45) Date of Patent: Oct. 22, 2024

(54) DISPLAY DEVICE HAVING A PLURALITY OF CONNECTING LINES

(71) Applicant: SAMSUNG DISPLAY CO., LTD., Yongin-si (KR)

(72) Inventors: Jinsung An, Seongnam-si (KR); Jiseon Lee, Hwaseong-si (KR); Seokje Seong, Seongnam-si (KR); Seongjun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/446,418

(22) Filed: Aug. 8, 2023

(65) Prior Publication Data

US 2024/0023396 A1 Jan. 18, 2024

Related U.S. Application Data

(63) Continuation of application No. 17/248,884, filed on Feb. 11, 2021, now Pat. No. 11,723,245.

(30) Foreign Application Priority Data

Mar. 6, 2020 (KR) ........................ 10-2020-0028628

(51) Int. Cl.
| | | |
|---|---|---|
| *H01L 27/14* | (2006.01) | |
| *H10K 59/121* | (2023.01) | |
| *H10K 59/126* | (2023.01) | |
| *H10K 59/131* | (2023.01) | |
| *H01L 27/12* | (2006.01) | |
| *H01L 29/786* | (2006.01) | |

(52) U.S. Cl.
CPC ....... *H10K 59/131* (2023.02); *H10K 59/1213* (2023.02); *H10K 59/126* (2023.02); *H01L 27/1225* (2013.01); *H01L 27/124* (2013.01); *H01L 27/1251* (2013.01); *H01L 29/78651* (2013.01); *H01L 29/7869* (2013.01)

(58) Field of Classification Search
CPC ............ H10K 59/131; H10K 59/1213; H10K 59/126; H10K 59/122; H10K 59/123; H10K 50/805; H01L 27/1225; H01L 27/124; H01L 27/1251; H01L 29/78651; H01L 29/7869; H01L 27/0207
USPC .................................................... 257/59, 72
See application file for complete search history.

(56) References Cited

U.S. PATENT DOCUMENTS

| | | | |
|---|---|---|---|
| 8,711,138 B2 | 4/2014 | Kawabe | |
| 9,627,462 B2 | 4/2017 | Kwon et al. | |
| 10,811,445 B2 * | 10/2020 | Murai | ............... H01L 29/78675 |

* cited by examiner

*Primary Examiner* — Tan N Tran
(74) *Attorney, Agent, or Firm* — Lewis Roca Rothgerber Christie LLP

(57) ABSTRACT

A display device having a plurality of pixel structures, each of the plurality of the pixel structures including: a substrate; a first active pattern on the substrate; a first gate line on the first active pattern and extending in a first direction; a first connecting pattern on the first gate line and configured to transmit an initialization voltage; a second connecting pattern on the first connecting pattern and electrically connected to the first active pattern and the first connecting pattern; and a first electrode on the second connecting pattern and configured to be initialized in response to the initialization voltage.

11 Claims, 23 Drawing Sheets

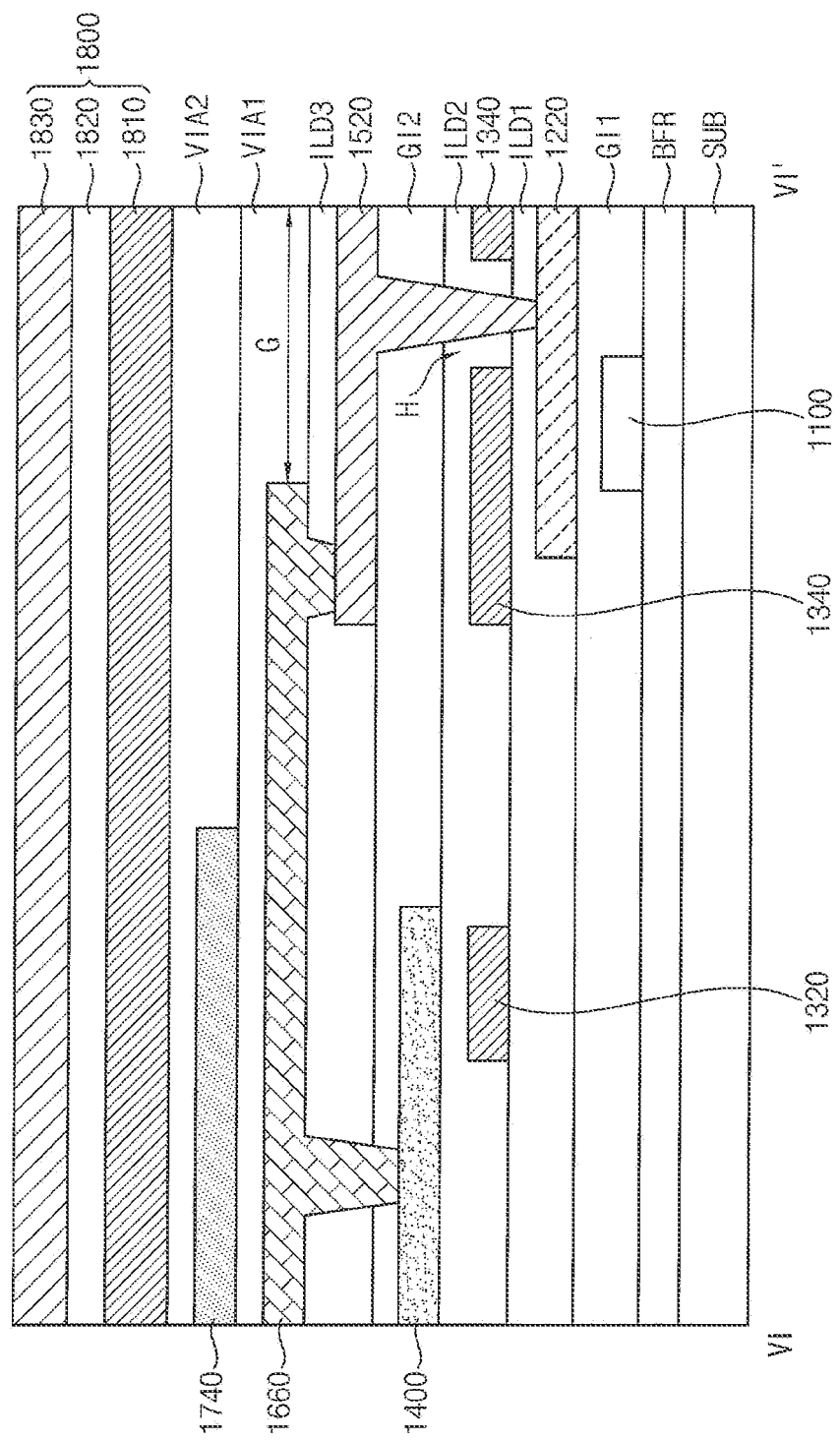

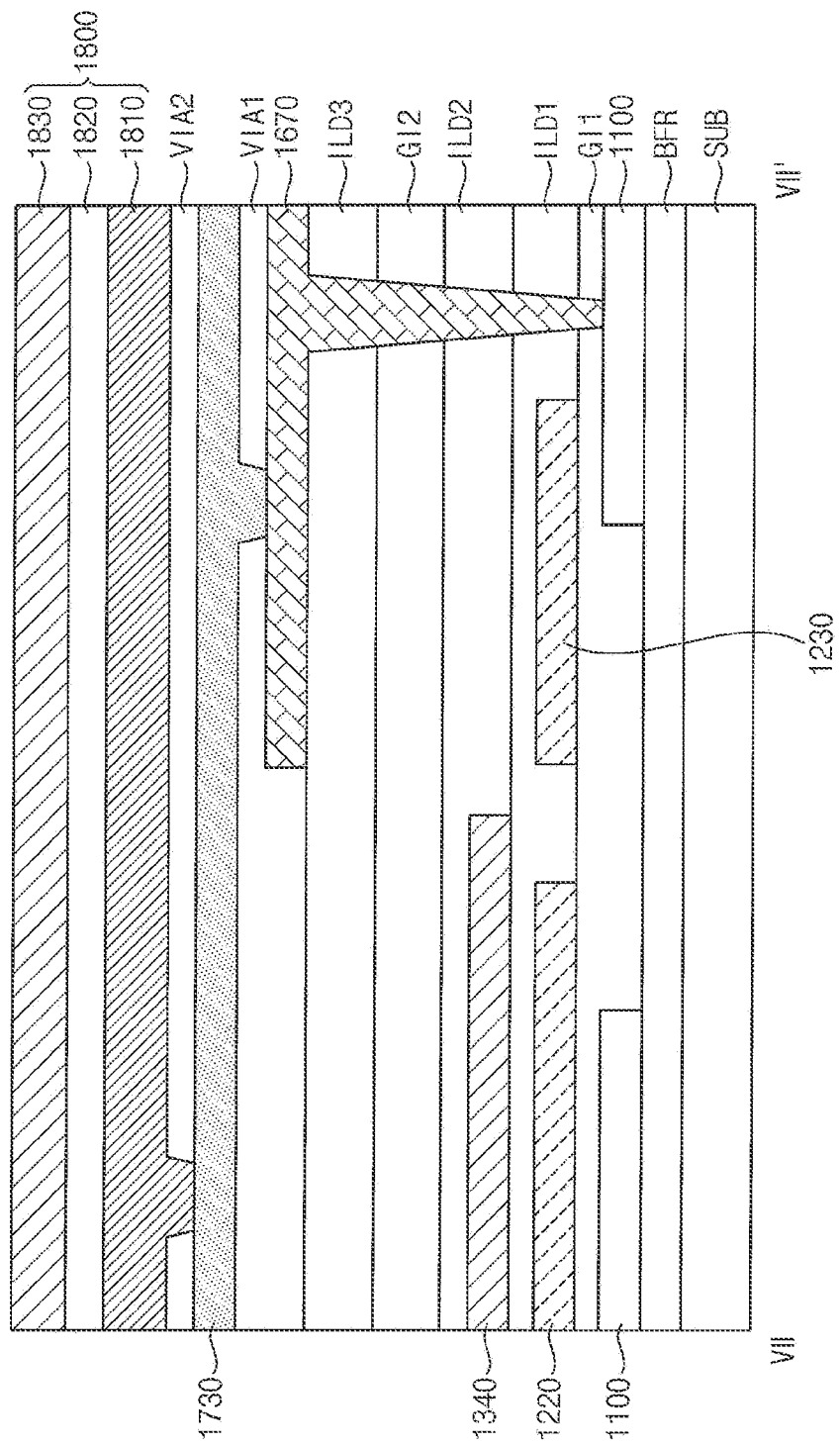

DISPLAY DEVICE HAVING A PLURALITY OF CONNECTING LINES

CROSS-REFERENCE TO RELATED APPLICATIONS

This application is a continuation of U.S. patent application Ser. No. 17/248,884, filed Feb. 11, 2021, which claims priority to and the benefit of Korean Patent Application No. 10-2020-0028628, filed Mar. 6, 2020, the entire content of both of which is incorporated herein by reference.

BACKGROUND

1. Field

Aspects of some example embodiments of the invention relate generally to a display device.

2. Discussion of the Background

In general, a display device includes a plurality of pixel structures. The pixel structures may include transistors, at least one storage capacitor, and an emitting diode. The transistors are formed of a plurality of electrodes and a plurality of lines, and various signals and voltages are transmitted to the electrodes and the lines. The emitting diode may emit light based on the signals and the voltages. Recently, in order to increase a resolution of the display device, an arrangement structure of the electrodes and the lines has been studied. At the same time, in order to improve the display quality of the display device, techniques for reducing crosstalk occurring between the electrodes and the lines have been studied.

The above information disclosed in this Background section is only for enhancement of understanding of the background and therefore the information discussed in this Background section does not necessarily constitute prior art.

SUMMARY

Aspects of some example embodiments of the invention relate generally to a display device, for example, a display device including a connecting pattern.

Display devices constructed according to some example embodiments of the present invention may provide a display device with relatively improved display quality.

Additional features of the inventive concepts will be set forth in the description which follows, and in part will be apparent from the description, or may be learned by practice of the inventive concepts.

A display device according to some example embodiments may include a plurality of pixel structures. Each of the plurality of the pixel structures may include a substrate, a first active pattern on the substrate, a first gate line on the first active pattern and extending in a first direction, a first connecting pattern on the first gate line and transmitting an initialization voltage, a second connecting pattern on the first connecting pattern and electrically connected to the first active pattern and the first connecting pattern, and a first electrode on the second connecting pattern and being initialized to the initialization voltage According to some example embodiments, the plurality of the pixel structures may include a first pixel structure and a second pixel structure arranged along the first direction. The display device may further include a first data line on the second connecting pattern, extending in a second direction intersecting the first direction, and transmitting a first data voltage to the first pixel structure, a second data line on the second connecting pattern, extending in the second direction, spaced apart from the first data line, and transmitting a second data voltage to the second pixel structure, and a vertical transmitting line on the second connecting pattern, extending in the second direction, and transmitting the second data voltage to the second data line.

According to some example embodiments, the first gate line may overlap at least one of the first connecting pattern or the second connecting pattern.

According to some example embodiments, the first gate line may overlap the vertical transmitting line.

According to some example embodiments, the first gate line, the first connecting pattern, the second connecting pattern, and the vertical transmitting line may overlap each other.

According to some example embodiments, the display device may further include a second gate line between the first gate line and the first connecting pattern and extending in the first direction. The second gate line may overlap the second connecting pattern.

According to some example embodiments, the second gate line may overlap the vertical transmitting line.

According to some example embodiments, the second gate line, the second connecting pattern, and the vertical transmitting line may overlap each other.

According to some example embodiments, the second gate line may be spaced apart from the first gate line on a plane.

According to some example embodiments, the display device may further include a third gate line in a same layer as the second gate line and extending in the first direction. The third gate line overlaps at least one of the first connecting pattern or the second connecting pattern.

According to some example embodiments, the third gate line may overlap the vertical transmitting line.

According to some example embodiments, the third gate line, the first connecting pattern, the second connecting pattern, and the vertical transmitting line may overlap each other.

According to some example embodiments, the third gate line may be spaced apart from the first gate line and the second gate line on a plane.

According to some example embodiments, the display device may further include a second active pattern on the second gate line and a first upper electrode on the second active pattern and overlapping the second gate line and the second active pattern.

According to some example embodiments, the display device may further include a second upper electrode in a same layer as the first upper electrode and overlapping the third gate line and the second active pattern.

According to some example embodiments, the first upper electrode may be electrically connected to the second gate line and the second upper electrode may be electrically connected to the third gate line.

According to some example embodiments, the display device may further include a horizontal transmitting line between the first connecting pattern and the vertical transmitting line, extending in the first direction, and electrically connected to the vertical transmitting line.

According to some example embodiments, the horizontal transmitting line may overlap the first connecting pattern.

According to some example embodiments, the horizontal transmitting line may be in a same layer as the second connecting pattern.

According to some example embodiments, the display device may further include a shielding pattern under the vertical transmitting line, extending in the first direction, and overlaps the vertical transmitting line.

According to some example embodiments, the display device may further include a gate electrode in a same layer as the first gate line, a second active pattern on the gate electrode, a third connecting pattern on the second active pattern and in contact with the gate electrode, and a fourth connecting pattern on the third connecting pattern and in contact with the third connecting pattern and the second active pattern. The third connecting pattern may be under the vertical transmitting line and the shielding pattern may be between the vertical transmitting line and the third connecting pattern.

According to some example embodiments, the first active pattern may be a silicon semiconductor, and the second active pattern may be an oxide semiconductor.

According to some example embodiments, the display device may further include a second gate line on a same layer as the first gate line, extending in the first direction, and overlapping the vertical transmitting line. The shielding pattern may overlap the second gate line.

According to some example embodiments, a constant voltage may be transmitted to the shielding pattern.

According to some example embodiments, the constant voltage may be a high power voltage, and the display device may further include a high power voltage line on a same layer as the vertical transmitting line, extending in the second direction, and transmitting the high power voltage to the shielding pattern.

According to some example embodiments, the shielding pattern may contact the high power voltage line and the first active pattern.

According to some example embodiments, the display device may further include a second active pattern on the first active pattern, and the high power voltage line may overlap the second active pattern.

A display device according to some example embodiments may include a plurality of pixel structures. Each of the plurality of pixel structures may include a substrate, a first active pattern on the substrate, a first gate line on the first active pattern and extending in a first direction, a first connecting pattern on the first gate line, a second connecting pattern on the first connecting pattern and electrically connected to the first active pattern and the first connecting pattern, and a transmitting line on the second connecting pattern and extending in a second direction intersecting the first direction. The first gate line, the first connecting pattern, the second connecting pattern, and the transmitting line may overlap each other.

According to some example embodiments, the plurality of the pixel structures may include a first pixel structure and a second pixel structure arranged along the first direction, and the display device may further include a first data line on the second connecting pattern, extending in the second direction, and transmitting a first data voltage to the first pixel structure and a second data line on the second connecting pattern, extending in the second direction, spaced apart from the first data line, and transmitting a second data voltage to the second pixel structure. The transmitting line may transmit the second data voltage to the second data line.

According to some example embodiments, the display device may further include a second gate line between the first gate line and the first connecting pattern and extending in the first direction, and spaced apart from the first gate line on a plane. The first active pattern, the second gate line, the second connecting pattern, and the transmitting line may overlap each other.

According to some example embodiments, the display device may further include a third gate line in a same layer as the second gate line, extending in the first direction, and spaced apart from the first gate line and the second gate line on a plane. The first active pattern, the third gate line, the first connecting pattern, and the transmitting line may overlap each other.

Therefore, in the display device according to some example embodiments, as the initialization voltage for initializing a first electrode is transmitted through the first connecting pattern and the second connecting pattern on the first connecting pattern, a crosstalk that may otherwise occur between the gate lines and the transmitting lines overlapping the gate lines can be prevented or reduced. Accordingly, display quality of the display device may be improved.

In addition, because the display device includes a shielding pattern, a crosstalk that may otherwise occur between the emission management line and the transmitting line overlapping the emission management line can be prevented or reduced.

It is to be understood that both the foregoing general description and the following detailed description describe aspects of some example embodiments and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention, and together with the description serve to explain aspects of embodiments according to the inventive concepts.

FIG. 22 is a cross-sectional view taken along the line VI-VI' of FIG. 16.

FIG. 23 is a cross-sectional view taken along the line VII-VII' of FIG. 16.

DETAILED DESCRIPTION

Illustrative, non-limiting example embodiments will be more clearly understood from the following detailed description in conjunction with the accompanying drawings.

Figure 1:
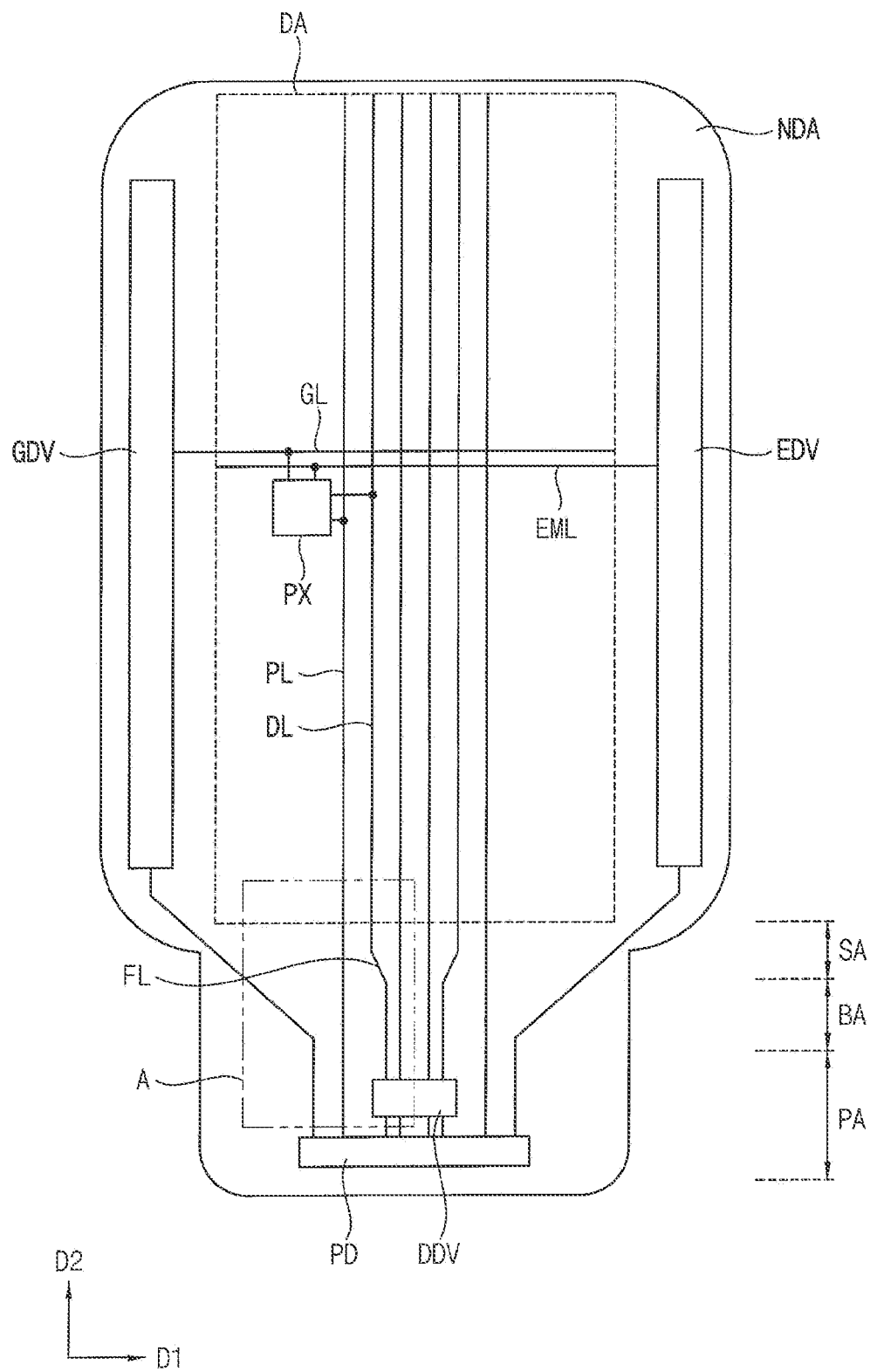
FIG. 1 is a plan view illustrating a display device according to some example embodiments.
Figure 2:
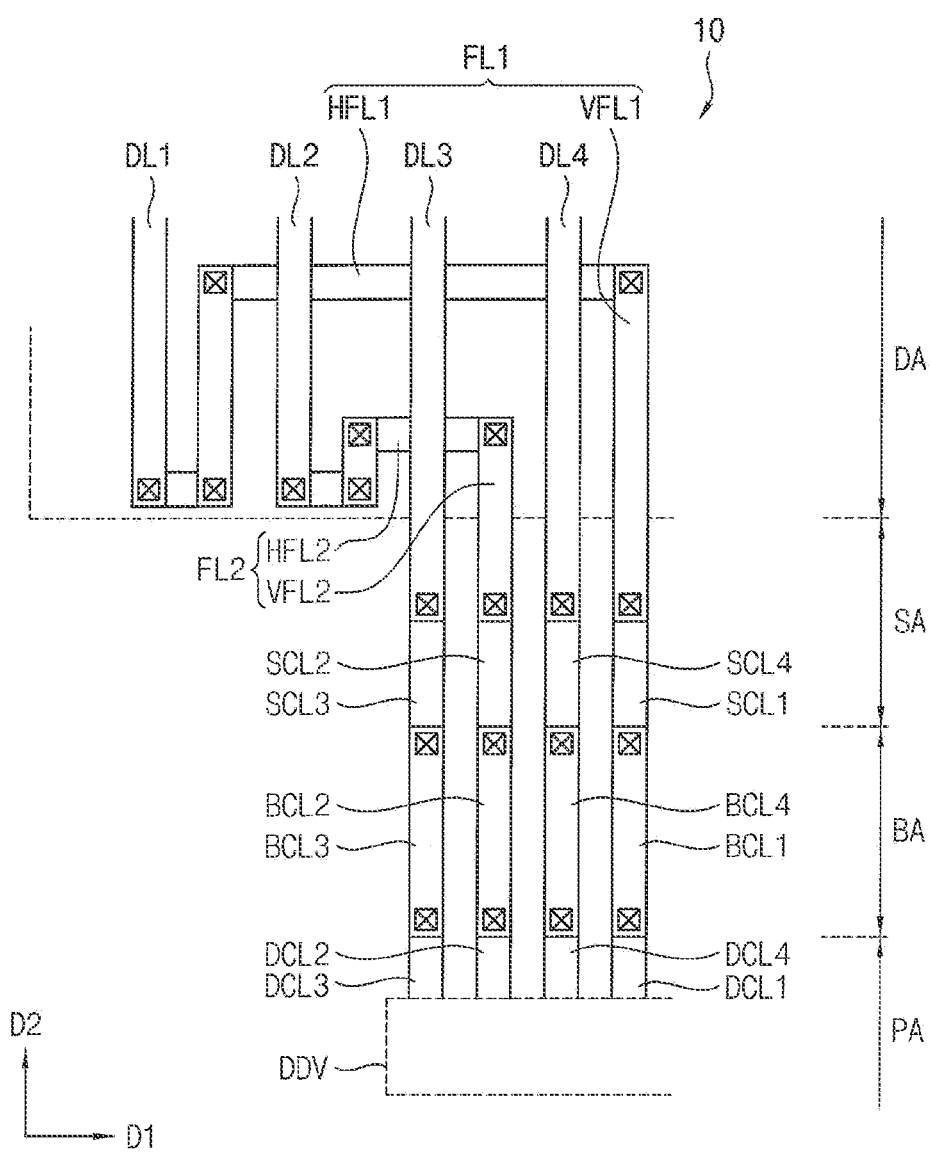
FIG. 2 is an enlarged view illustrating a transmitting line included in the display device of FIG. 1.
Figure 3:
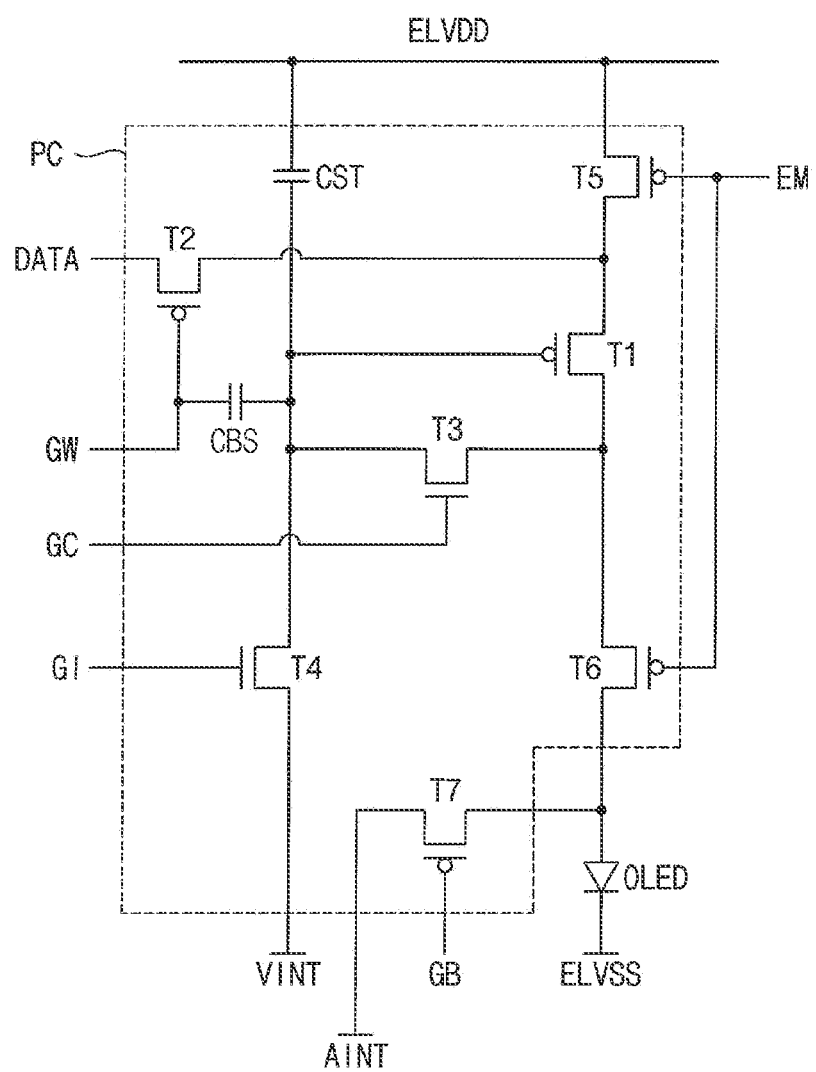
FIG. 3 is a circuit diagram illustrating an example of a pixel circuit and an organic light emitting diode included in the display device of FIG. 1.

FIG. 1 is a plan view illustrating a display device according to some example embodiments. FIG. 2 is an enlarged view illustrating a transmitting line included in the display device of FIG. 1. FIG. 3 is a circuit diagram illustrating an example of a pixel circuit and an organic light emitting diode included in the display device of FIG. 1. For example, FIG. 2 may be an enlarged view of an area A of FIG. 1.

Referring to FIGS. 1, 2, and 3, a display device 10 according to some example embodiments may include a display area DA and a non-display area NDA surrounding the display area DA. The non-display area NDA may include a bending area BA which can be bent, a peripheral area SA between the display area DA and the bending area BA, and a pad area PA.

For example, a pixel structure PX may be located in the display area DA and a driver for driving the pixel structure PX may be located in the non-display area NDA. For example, a pad part PD and a data driver DDV may be located in the pad area PA and the bending area BA may be bent based on a virtual bending axis. Because the pixel structure PX is not located in the peripheral area SA, a width extending in a second direction D2 of the peripheral area SA may be defined as a dead space of the display device 10.

The pixel structure PX, a data line DL connected to the pixel structure PX, a gate line GL connected to the pixel structure PX, an emission management line EML connected to the pixel structure PX, a driving voltage line PL connected to the pixel structure PX, and a connecting line CL connected to the pixel structure PX may be located in the display area DA.

The data line DL may be electrically connected to the data driver DDV and may extend along the second direction D2. The data line DL may receive a data voltage DATA from the data driver DDV and may transmit the data voltage DATA to the pixel structure PX.

The gate line GL may be electrically connected to a gate driver GDV and may extend along a first direction D1 intersecting the second direction D2. The gate line GL may receive a gate signal from the gate driver GDV and transmit the gate signal to the pixel structure PX.

The emission management line EML may be electrically connected to an emission driver EDV and may extend along the first direction D1. The emission management line EML may receive an emission management signal EM from the emission driver EDV and may transmit the emission management signal EM to the pixel structure PX. For example, an activation period of the emission management signal EM may be an emission period of the display device 10 and an inactivation period of the emission management signal EM may be a non-emission period of the display device 10.

The driving voltage line PL may be electrically connected to the pad part PD and may extend along the second direction D2. The driving voltage line PL may receive a high power voltage ELVDD from the pad part PD and may transmit the high power voltage ELVDD to the pixel structure PX. Meanwhile, a low power voltage ELVSS may be commonly transmitted to an opposite electrode (e.g., a cathode electrode) of an organic light emitting diode OLED.

The transmitting line FL may be electrically connected to the data driver DDV and the data line DL. The transmitting line FL may receive the data voltage DATA from the data driver DDV and may transmit the data voltage DATA to the data line DL.

The driver may include the gate driver GDV, the data driver DDV, the emission driver EDV, and the pad part PD. In addition, the driver may further include a timing controller and the timing controller may control the gate driver GDV, the data driver DDV, the emission driver EDV, and the pad part PD.

The gate driver GDV may receive a voltage from the pad part PD to generate the gate signal. For example, the gate signal may include a first gate signal GW, a second gate signal GC, a third gate signal GI, and a fourth gate signal GB.

The data driver DDV may generate the data voltage DATA corresponding to the emission period and the non-emission period. The emission driver EDV may receive a voltage from the pad part PD to generate the emission management signal EM. The pad part PD may be electrically connected to an external device and may transmit the voltages to the gate driver GDV, the emission driver EDV, and the driving voltage line PL, respectively.

Meanwhile, the gate driver GDV and the emission driver EDV are respectively located on the left and right sides of the display device 10 in FIG. 1, but the present invention is not limited thereto.

In addition, the data driver DDV is mounted in the non-display area NDA of the display device 10 in FIG. 1, but the present invention is not limited thereto. For example, the data driver DDV may be located on a separate flexible printed circuit board ("FPCB"), and the pad part PD may be electrically connected to the FPCB.

According to some example embodiments, as shown in FIG. 2, the data line DL and the transmitting line FL may be located in the display area DA. For example, first to fourth data lines DL1, DL2, DL3, and DL4, a first transmitting line FL1, and a second transmitting line FL2 may be located in the display area DA. For example, the transmitting line FL may be a fan-out line electrically connecting the data driver DDV and the data line DL.

For example, the pixel structure PX may include first to fourth pixel structures arranged along the first direction D1. The first data line DL1 may be connected to the first pixel structure, the second data line DL2 may be connected to the second pixel structure, the third data line DL3 may be connected to the third pixel structure, and the fourth data line DL4 may be connected to the fourth pixel structure.

According to some example embodiments, the first transmitting line FL1 may include a first vertical transmitting line VFL1 and a first horizontal transmitting line HFL1, and the second transmitting line FL2 may include a second vertical transmitting line VFL2 and a second horizontal transmitting line HFL2. For example, the first and second vertical transmitting lines VFL1 and VFL2 may extend in the second direction D2, and the first and second horizontal transmitting lines HFL1 and HFL2 may extend in the first direction D1.

The first transmitting line FL1 may electrically connect the data driver DDV and the first data line DL1. For example, a first data voltage may be transmitted to the first pixel structure through the first transmitting line FL1 and the first data line DL1.

For example, the first vertical transmitting line VFL1 may be connected to a first connecting line SCL1, the first connecting line SCL1 may be connected to a first bending transmitting line BCL1, and the first bending transmitting line BCL1 may be connected to a first data transmitting line DCL1.

Figure 15:
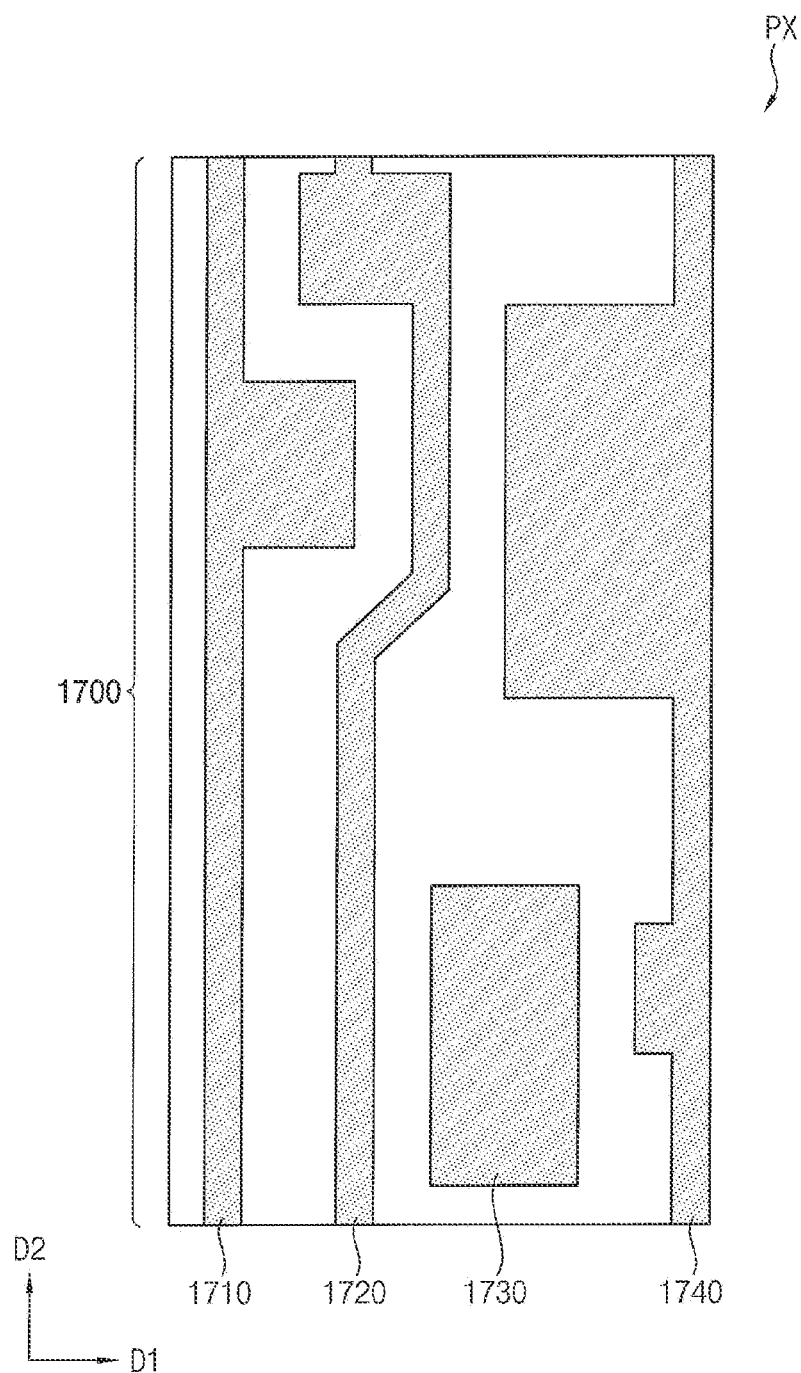

For example, the first vertical transmitting line VFL1 may extend from the peripheral area SA to the display area DA, and may be formed in a first layer (for example, in FIG. 15, a first layer in which the fifth conductive pattern 1700 is formed). The first connecting line SCL1 may be located in the peripheral area SA and may be formed in a second layer (for example, in FIG. 6, a second layer in which the first conductive pattern 1200 is formed) located under the first layer. The first bending transmitting line BCL1 may be located in the bending area BA and may be formed in the first layer. The first data transmitting line DCL1 may be located in the pad area PA and may receive the first data voltage from the data driver DDV.

The second transmitting line FL2 may electrically connect the data driver DDV and the second data line DL2. For example, a second data voltage may be transmitted to the second pixel structure through the second transmitting line FL2 and the second data line DL2.

For example, the second vertical transmitting line VFL2 may be connected to a second connecting line SCL2, the second connecting line SCL2 may be connected to a second bending transmitting line BCL2, and the second bending transmitting line BCL2 may be connected to a second data transmitting line DCL2. However, a structure of the second vertical transmitting line VFL2, the second connecting line SCL2, the second bending transmitting line BCL2, and the second data transmitting line DCL2 may be a substantially same as a structure of the first vertical transmitting line VFL1, the first connecting line SCL1, the first bending transmitting line BCL1, and the first data transmitting line DCL1, and thus detailed descriptions thereof will be omitted.

The third data line DL3 may be connected to the data driver DDV. For example, a third data voltage may be transmitted to the third pixel structure through the third data line DL3.

For example, the third data line DL3 may be connected to a third connecting line SCL3, the third connecting line SCL3 may be connected to a third bending transmitting line BCL3, and the third bending transmitting line BCL3 may be connected to a third data transmitting line DCL3.

For example, the third data line DL3 may extend from the peripheral area SA to the display area DA, and may be formed in the first layer. The third connecting line SCL3 may be located in the peripheral area SA and may be formed in a third layer (for example, in FIG. 7, a third layer in which the second conductive pattern 1300 is formed) located under the first layer. The third bending transmitting line BCL3 may be located in the bending area BA and may be formed in the first layer. The third data transmitting line DCL3 may be located in the pad area PA and may receive the third data voltage from the data driver DDV.

The fourth data line DL4 may be connected to the data driver DDV. For example, a fourth data voltage may be transmitted to the fourth pixel structure through the fourth data line DL4.

For example, the fourth data line DL4 may be connected to a fourth connecting line SCL4, the fourth connecting line SCL4 may be connected to a fourth bending transmitting line BCL4, and the fourth bending transmitting line BCL4 may be connected to a fourth data transmitting line DCL4. However, a structure of the fourth data line DL4, the fourth connecting line SCL4, the fourth bending transmitting line BCL4, and the fourth data transmitting line DCL4 may be a substantially same as a structure of the third data line DL3, the third connecting line SCL3, the third bending transmitting line BCL3, and the third data transmitting line DCL3, and thus detailed descriptions thereof will be omitted.

According to some example embodiments, the second layer may be located under the third layer. For example, the first and second connecting lines SCL1 and SCL2 may be located under the third and fourth connecting lines SCL3 and SCL4. Accordingly, a space margin may be secured in the second layer (or in the third layer) of the peripheral area SA, and additional lines may be further located in the space margin. However, the present invention is not limited thereto, and the connection structure and arrangement position of the above-described lines may be set as necessary.

In addition, because the transmitting line FL is located in the display area DA, a width extending in the second direction D2 of the peripheral area SA of the display device 10 may be reduced compared to a width extending in the second direction D2 of a peripheral area of a conventional display device. In other words, the dead space of the display device 10 may be reduced.

A pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED and may transmit a driving current to the organic light emitting diode OLED.

The organic light emitting device OLED may include a first terminal (e.g., an anode terminal) and a second terminal (e.g., a cathode terminal). The first terminal of the organic light emitting diode OLED may be electrically connected to the first transistor T1 through the sixth transistor T6 and may receive the driving current. The second terminal may receive the low power voltage ELVSS. The organic light emitting diode OLED may generate a light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain a voltage level of a gate terminal of the first transistor T1 during an inactive period of the first gate signal GW.

The boosting capacitor CBS may include a first terminal and a second terminal. The first terminal of the boosting capacitor CBS may be connected to the gate terminal of the first transistor T1, and the second terminal of the boosting capacitor CBS may receive the first gate signal GW. When a provision of the first gate signal GW is stopped, the boosting capacitor CBS may compensate for a voltage drop of the gate terminal of the first transistor T1 by increasing the voltage level of the gate terminal.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the organic light emitting device OLED through the sixth transistor T6 to transmit the driving current. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or turned off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may transmit the data voltage DATA to the first terminal of the first transistor T1 while the second transistor T2 is turned on. For example, the second transistor T2 may be referred to as a switching transistor.

The third transistor T3 may include a gate terminal, a first terminal (e.g., a source terminal), and a second terminal (e.g., a drain terminal). The gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or turned off in response to the second gate signal GC. For example, when the third transistor T3 is an NMOS transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. Because the first transistor T1 is diode-connected, a voltage difference equal to the threshold voltage of the first transistor T1 may occur between the gate terminal of the first transistor T1 and the first terminal of the first transistor T1. Accordingly, during the period in which the third transistor T3 is turned on, a voltage obtained by adding the data voltage DATA and the voltage difference may be transmitted to the gate terminal of the first transistor T1. Therefore, the third transistor T3 may compensate for the threshold voltage of the first transistor T1. For example, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive the third gate signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or turned off in response to the third gate signal GI. For example, when the fourth transistor T4 is the NMOS transistor, the fourth transistor T4 may be turned on when the third gate signal GI has a positive voltage level, and may be turned off when the third gate signal GI has a negative voltage level.

During a period in which the fourth transistor T4 is turned on in response to the third gate signal GI, the gate initialization voltage VINT may be transmitted to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission management signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission management signal EM, the fifth transistor T5 may transmit the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission management signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission management signal EM, the sixth transistor T6 may transmit the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may receive an initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may transmit the initialization voltage AINT to the organic light emitting diode OLED. Accordingly, the seventh transistor T7 may initialize the first terminal of the organic light emitting diode OLED to the initialization voltage AINT. For example, the seventh transistor T7 may be referred to as an initialization transistor.

Meanwhile, the connection structure of the pixel circuit PC illustrated in FIG. 3 is an example and may be variously changed.

FIGS. 4 to 16 are layout diagrams illustrating a pixel structure included in the display device of FIG. 1.

Figure 4:
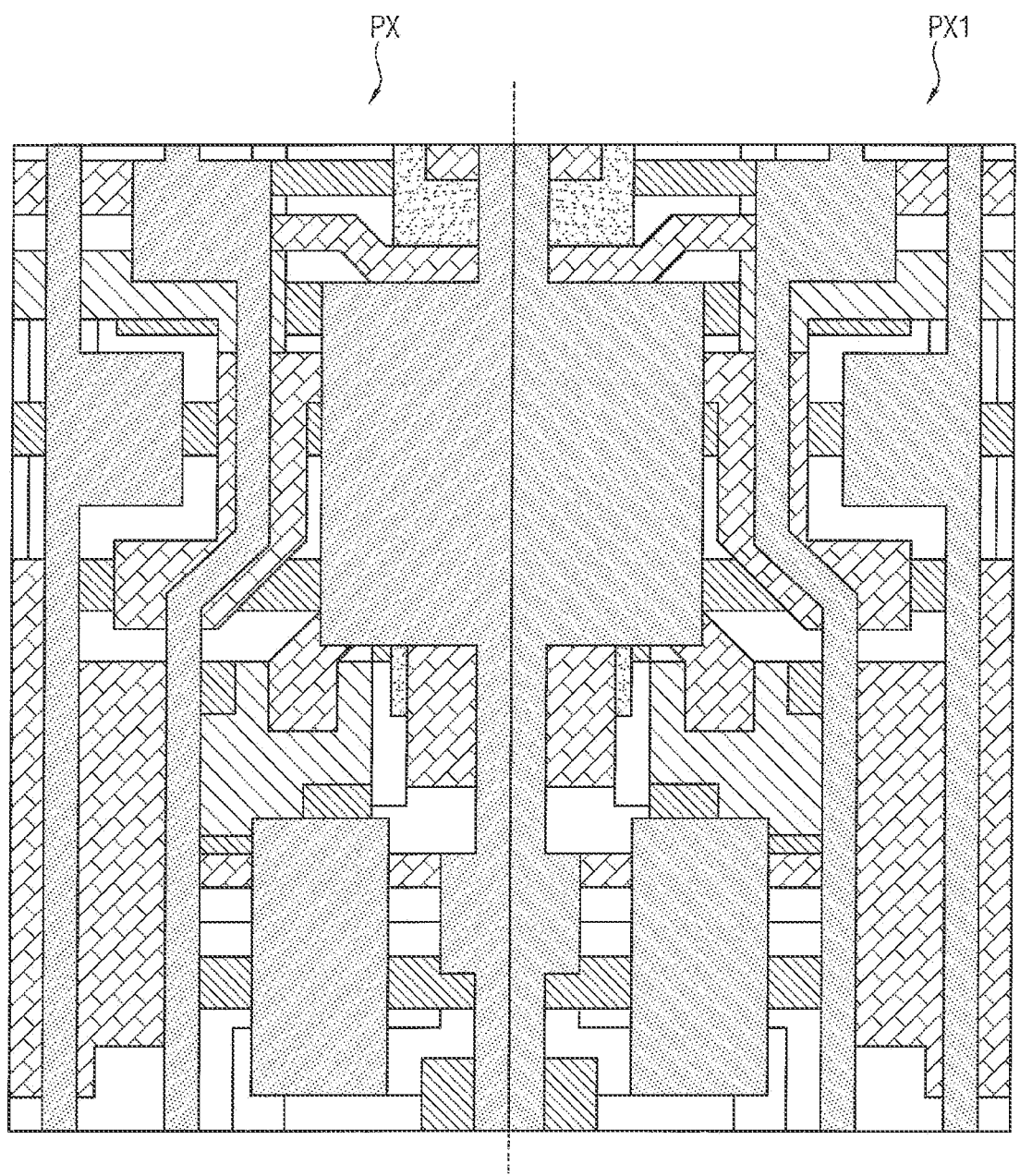
FIGS. 4 to 16 are layout diagrams illustrating a pixel structure included in the display device of FIG. 1.
Figure 5:
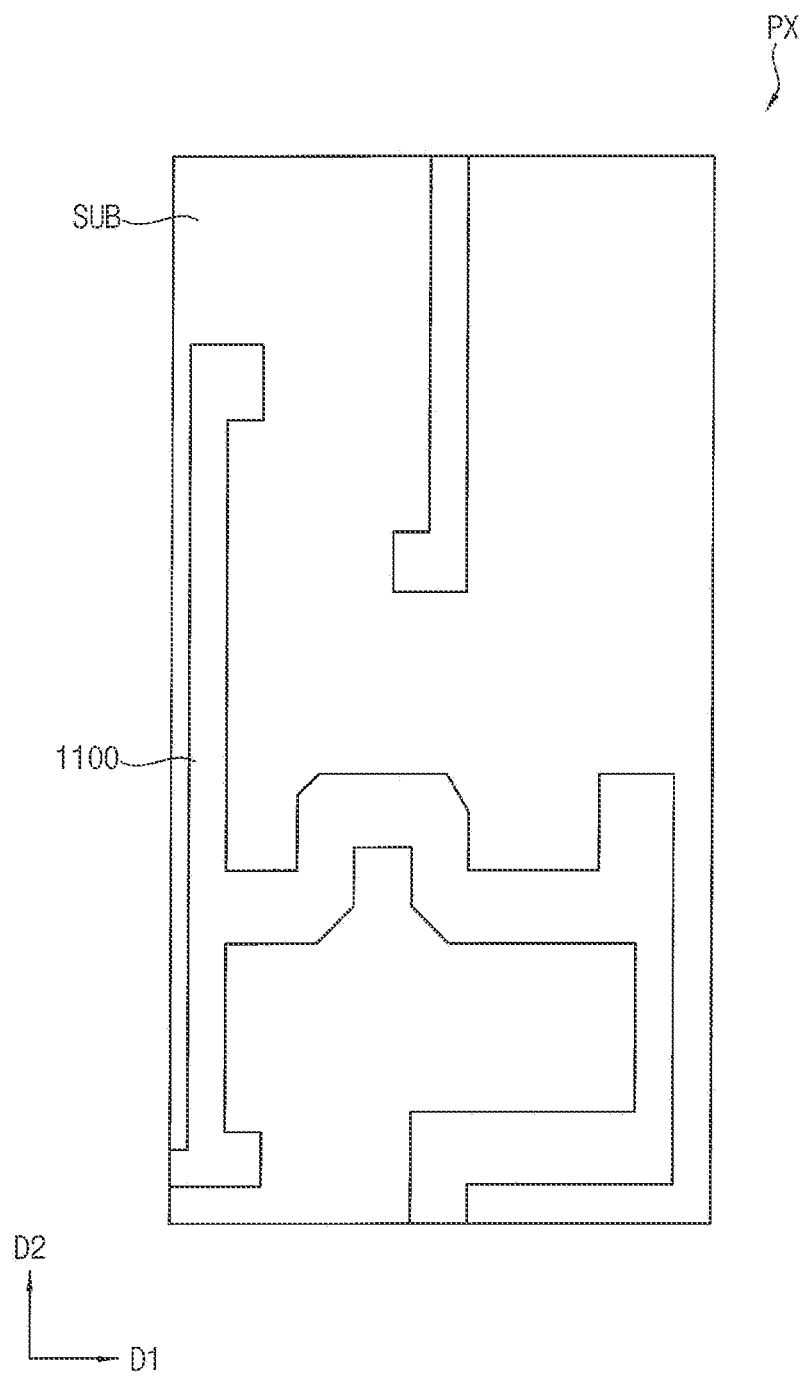

Referring to FIG. 4, the display device 10 may include the pixel structure PX and a symmetric pixel structure PX1 adjacent to the pixel structure PX. For example, a structure of the symmetric pixel structure PX1 may be substantially the same as a structure in which the structure of the pixel structure PX is symmetrical with respect to an imaginary symmetric line SL. Hereinafter, the pixel structure PX will be described Referring to FIG. 5, the pixel structure PX may include a substrate SUB and a first active pattern 1100 located on the substrate SUB.

The substrate SUB may include a glass substrate, a quartz substrate, a plastic substrate, or the like. According to some example embodiments, the substrate SUB may include a plastic substrate, and thus the display device 10 may be a flexible display device. In this case, the substrate SUB may have a structure in which at least one organic film layer and at least one barrier layer are alternately stacked. For example, the organic film layer may be formed of an organic material such as polyimide, and the barrier layer may be formed of an inorganic material such as silicon oxide or silicon nitride.

A buffer layer may be located on the substrate SUB. The buffer layer may prevent or reduce diffusion of metal atoms or impurities from the substrate SUB into the first active pattern 1100. In addition, the buffer layer may uniformly form the first active pattern 1100 by controlling a heat transfer rate during a crystallization process for forming the first active pattern 1100.

The first active pattern 1100 may be located on the buffer layer. According to some example embodiments, the first active pattern 1100 may be a silicon semiconductor. For example, the first active pattern 1100 may include amorphous silicon, polycrystalline silicon, or the like.

According to some example embodiments, ions may be selectively implanted into the first active pattern 1100. For example, when the first and second transistors T1 and T2 are the PMOS transistors, the first active pattern 1100 may include a source region into which cations is implanted, a drain region into which cations is implanted, and a channel area into which cations are not implanted.

A first gate insulating layer (e.g., a first gate insulating layer Gil of FIG. 17) may cover the first active pattern 1100 and may be located on the substrate SUB. The first gate insulating layer may include an insulating material. For example, the first gate insulating layer may include silicon oxide, silicon nitride, titanium oxide, tantalum oxide, or the like.

Figure 6:
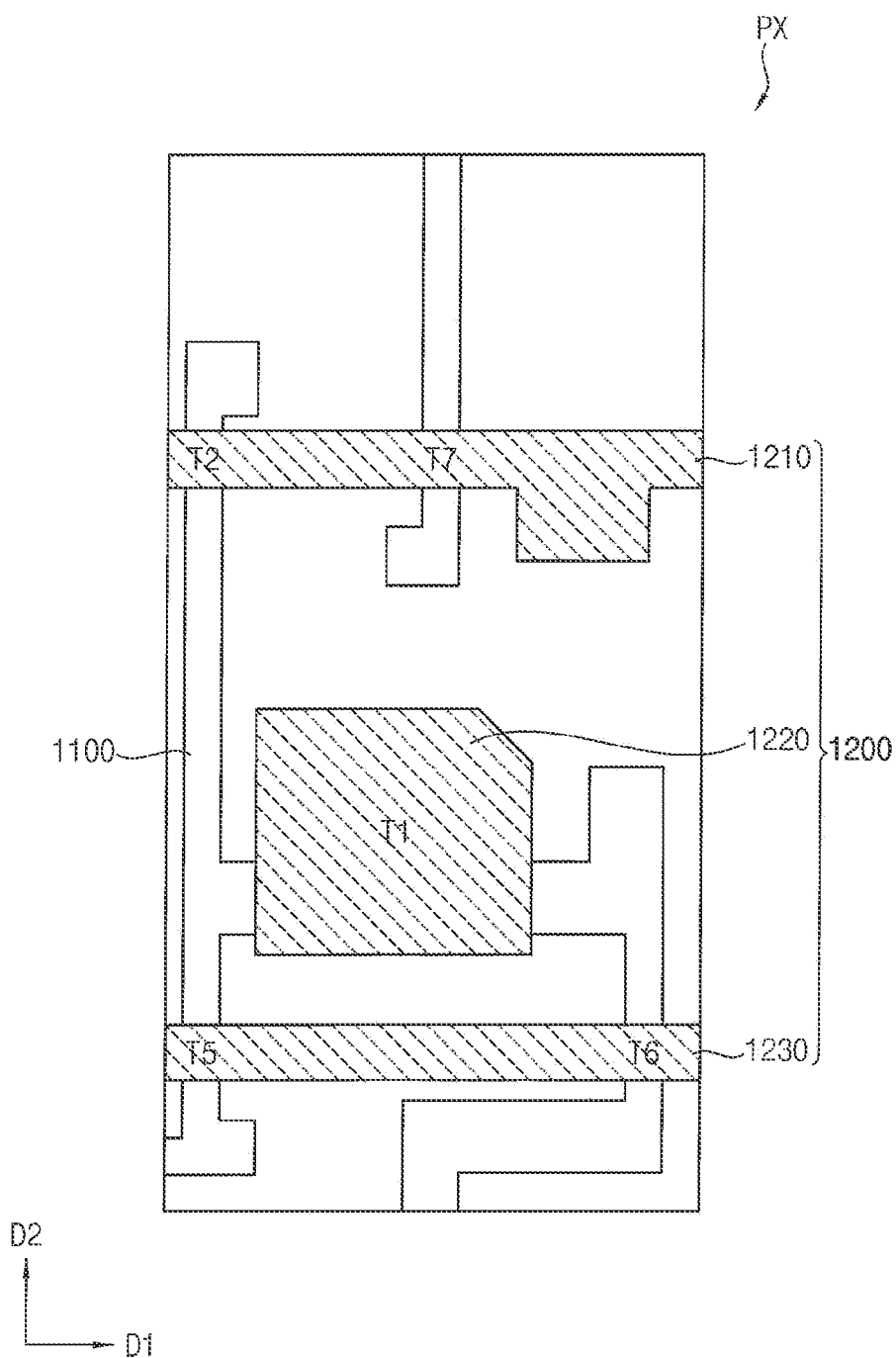

Referring to FIG. 6, a first conductive pattern 1200 may be located on the first gate insulating layer. The first conductive pattern 1200 may include a first gate line 1210, a gate electrode 1220, and a second gate line 1230.

The first gate line 1210 may be located on the first active pattern 1100 and may extend in the first direction D1. According to some example embodiments, the first gate line 1210 may constitute the second transistor T2 together with a part of the first active pattern 1100. For example, the first gate signal GW may be transmitted to the first gate line 1210.

For example, the first gate line 1210 may constitute the seventh transistor T7 together with another part of the first active pattern 1100. The fourth gate signal GB may be transmitted to the first gate line 1210. The first gate signal GW and the fourth gate signal GB may have a substantially same waveform with a time difference.

The gate electrode 1220 may constitute the first transistor T1 together with a part of the first active pattern 1100.

The second gate line 1230 may be located on the first active pattern 1100 and may extend in the first direction D1. For example, the second gate line 1230 may constitute the fifth and sixth transistors T5 and T6 together with parts of the first active pattern 1100. For example, the second gate line 1230 may be referred to as an emission management line.

For example, the first conductive pattern 1200 may include a metal, an alloy, a conductive metal oxide, a transparent conductive material, or the like. For example, the first conductive pattern 1200 may include silver ("Ag"), an alloy containing silver, molybdenum ("Mo"), an alloy containing molybdenum, aluminum ("Al"), an alloy containing aluminum, Aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

A first interlayer insulating layer (e.g., a first interlayer insulating layer ILD1 of FIG. 17) may cover the first conductive pattern 1200 and may be located on the first gate insulating layer. The first interlayer insulating layer may include an insulating material.

Meanwhile, the first, second, fifth, sixth, and seventh transistors T1, T2, T5, T6, and T7 may correspond to the first, second, fifth, sixth and seventh transistors T1, T2, T5, T6, and T7 described with reference to FIG. 3. For example, the first gate electrode 1230 may correspond to the gate terminal of the first transistor T1 described with reference to FIG. 3.

In addition, the gate terminals, the first terminals, and the second terminals described with reference to FIG. 3 may substantially correspond to conductive patterns to be described in more detail later. However, this correspondence relationship will not be described in detail, and the correspondence will be apparent to those skilled in the art to which the present invention belongs.

Figure 7:
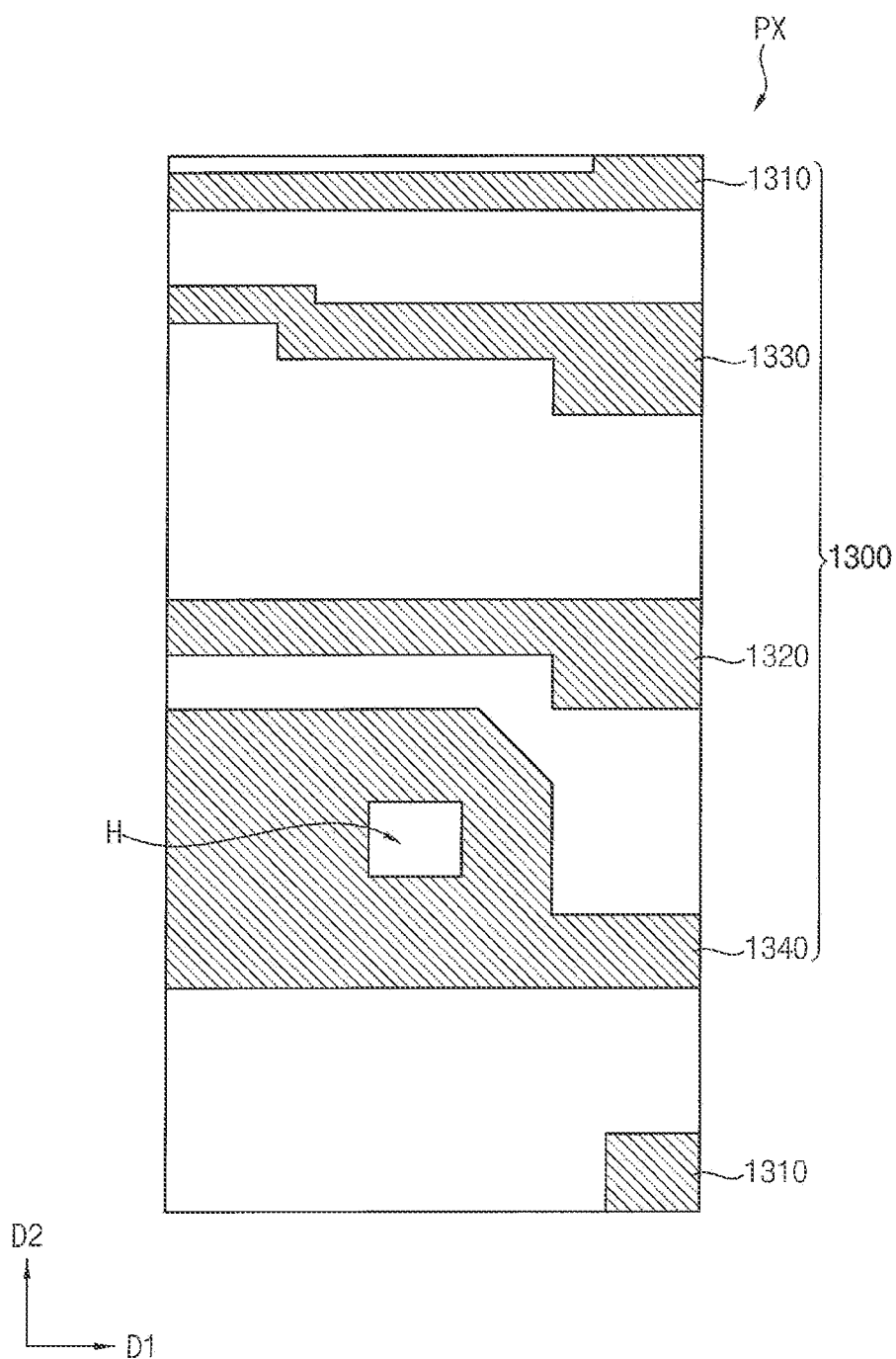
Figure 8:
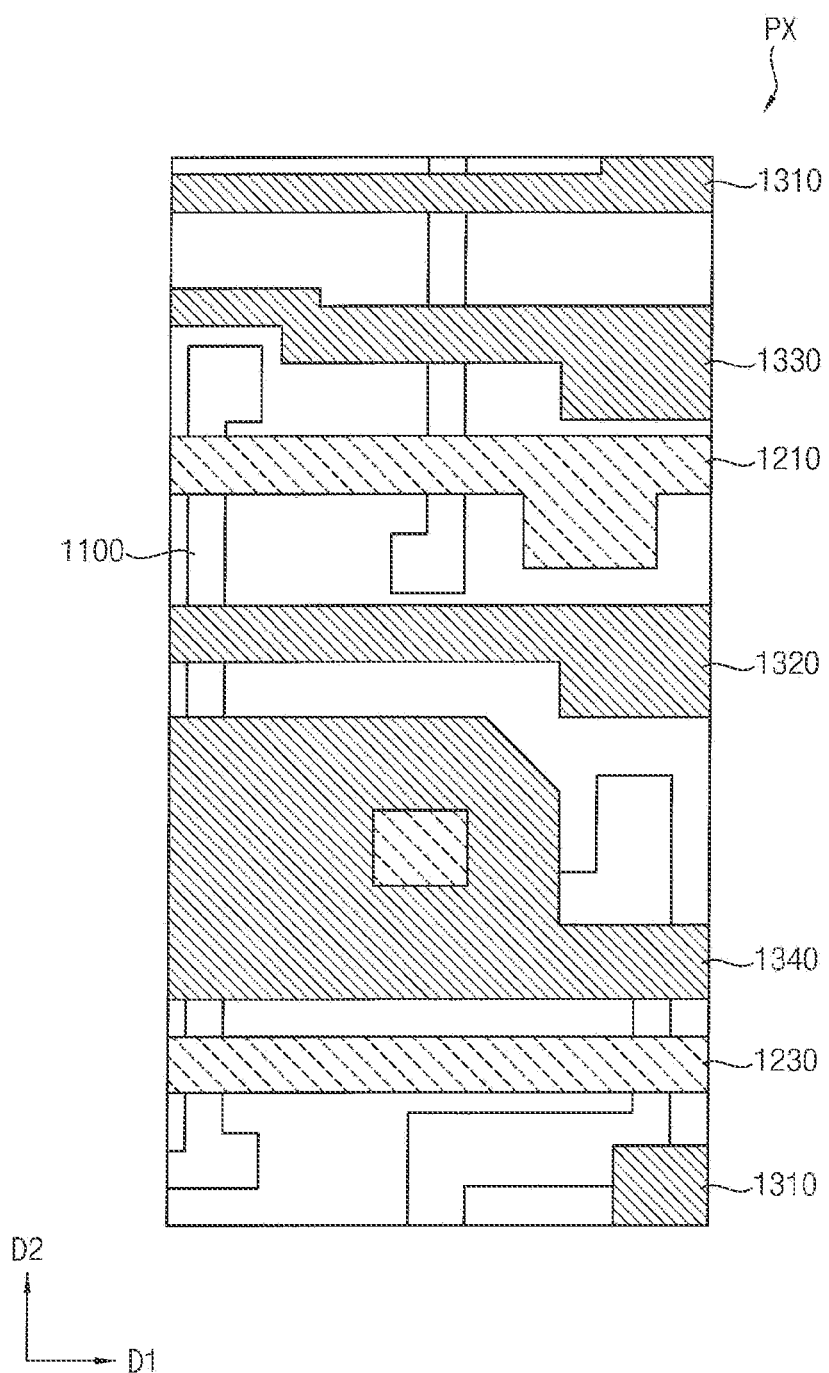

Referring to FIGS. 7 and 8, a second conductive pattern 1300 may be located on the first interlayer insulating layer. The second conductive pattern 1300 may include a gate initialization voltage line 1310, a third gate line 1320, a fourth gate line 1330, and a storage capacitor electrode 1340.

The gate initialization voltage line 1310 may extend in the first direction D1. According to some example embodiments, the gate initialization voltage line 1310 may transmit the gate initialization voltage VINT to the fourth transistor T4. For example, the gate initialization voltage line 1310 may transmit the gate initialization voltage VINT to a second active pattern (e.g., a second active pattern 1400 of FIG. 9).

The third gate line 1320 may extend in the first direction D1. According to some example embodiments, the third gate line 1320 may transmit the second gate signal GC to the third transistor T3. For example, the third gate line 1320 may contact a first upper electrode (e.g., a first upper electrode 1530 of FIG. 18).

The fourth gate line 1330 may extend in the first direction D1. According to some example embodiments, the fourth gate line 1330 may transfer the third gate signal GI to the fourth transistor T4. For example, the fourth gate line 1330 may contact a second upper electrode (e.g., a second upper electrode 1540 in FIG. 19).

The storage capacitor electrode 1340 may extend in the first direction D1. According to some example embodiments, the storage capacitor electrode 1340 may constitute the storage capacitor CST together with the gate electrode 1220. For example, the storage capacitor electrode 1340 may overlap the gate electrode 1220, and the high power voltage ELVDD may be transmitted to the storage capacitor electrode 1340.

According to some example embodiments, the storage capacitor electrode 1340 may include an opening H exposing an upper surface of the gate electrode 1220. The gate electrode 1220 may contact a third connecting pattern (e.g., a third connecting pattern 1520 of FIG. 22) through the opening H. For example, the gate terminal of the first transistor T1 and the first terminal of the third transistor T3 may be electrically connected to each other through the opening H.

For example, the second conductive pattern 1300 may include a metal, an alloy, a conductive metal oxide, a transparent conductive material, or the like.

A second interlayer insulating layer (e.g., a second interlayer insulating layer ILD2 in FIG. 17) may cover the second conductive pattern 1300 and may be located on the first interlayer insulating layer. The second interlayer insulating layer may include an insulating material.

Figure 9:
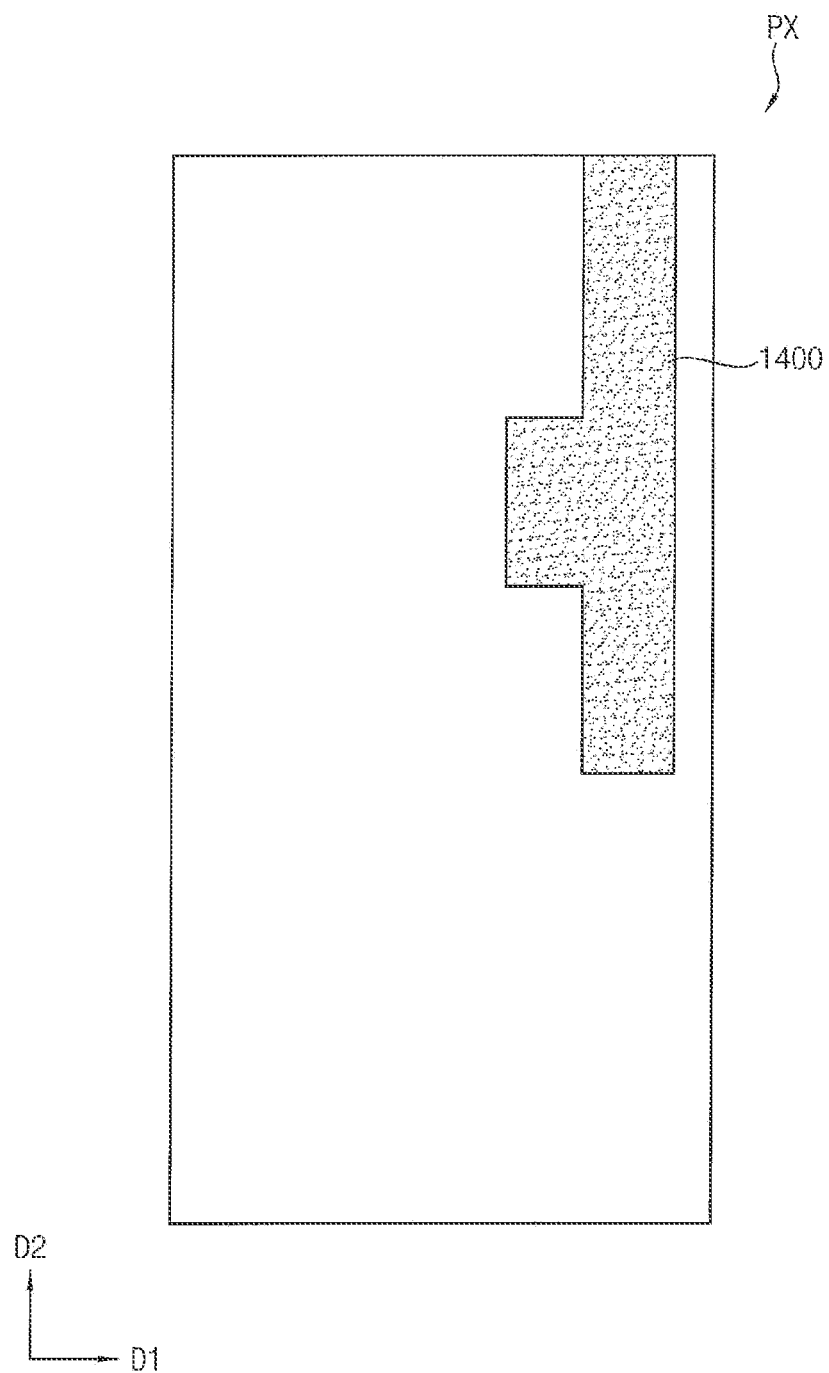
Figure 10:
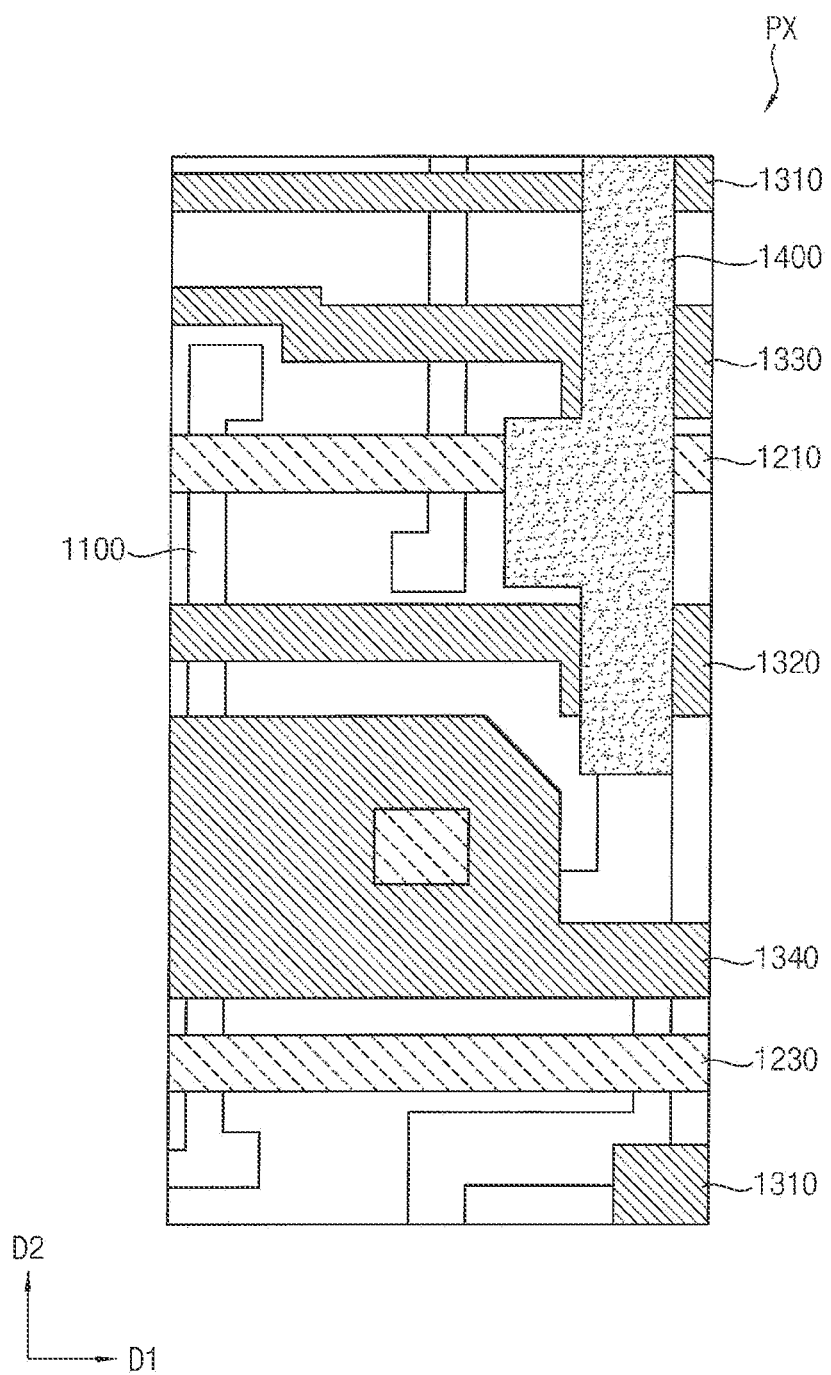

Referring to FIGS. 9 and 10, the second active pattern 1400 may be located on the second interlayer insulating layer. For example, the second active pattern 1400 may overlap the third gate line 1320 and the fourth gate line 1330.

According to some example embodiments, the second active pattern 1400 may be located on a different layer from the first active pattern 1100 and may not overlap the first active pattern 1100. In other words, the second active pattern 1400 may be formed separately from the first active pattern

1100. For example, the first active pattern 1100 may be the silicon semiconductor, and the second active pattern 2400 may be an oxide semiconductor.

According to some example embodiments, the pixel structure PX may include the first, second, fifth, sixth, and seventh transistors T1, T2, T5, T6, and T7, which are silicon-based semiconductor elements, and the third and fourth transistors T3 and T4 which are oxide-based semiconductor elements. For example, the first, second, fifth, sixth and seventh transistors T1, T2, T5, T6, and T7 may be the PMOS transistors, and the third and fourth transistors T3 and T4 may be the NMOS transistors.

A second gate insulating layer (e.g., a second gate insulating layer GI2 in FIG. 17) may cover the second active pattern 1400 and may be located on the second interlayer insulating layer. The second gate insulating layer may include an insulating material.

Figure 11:
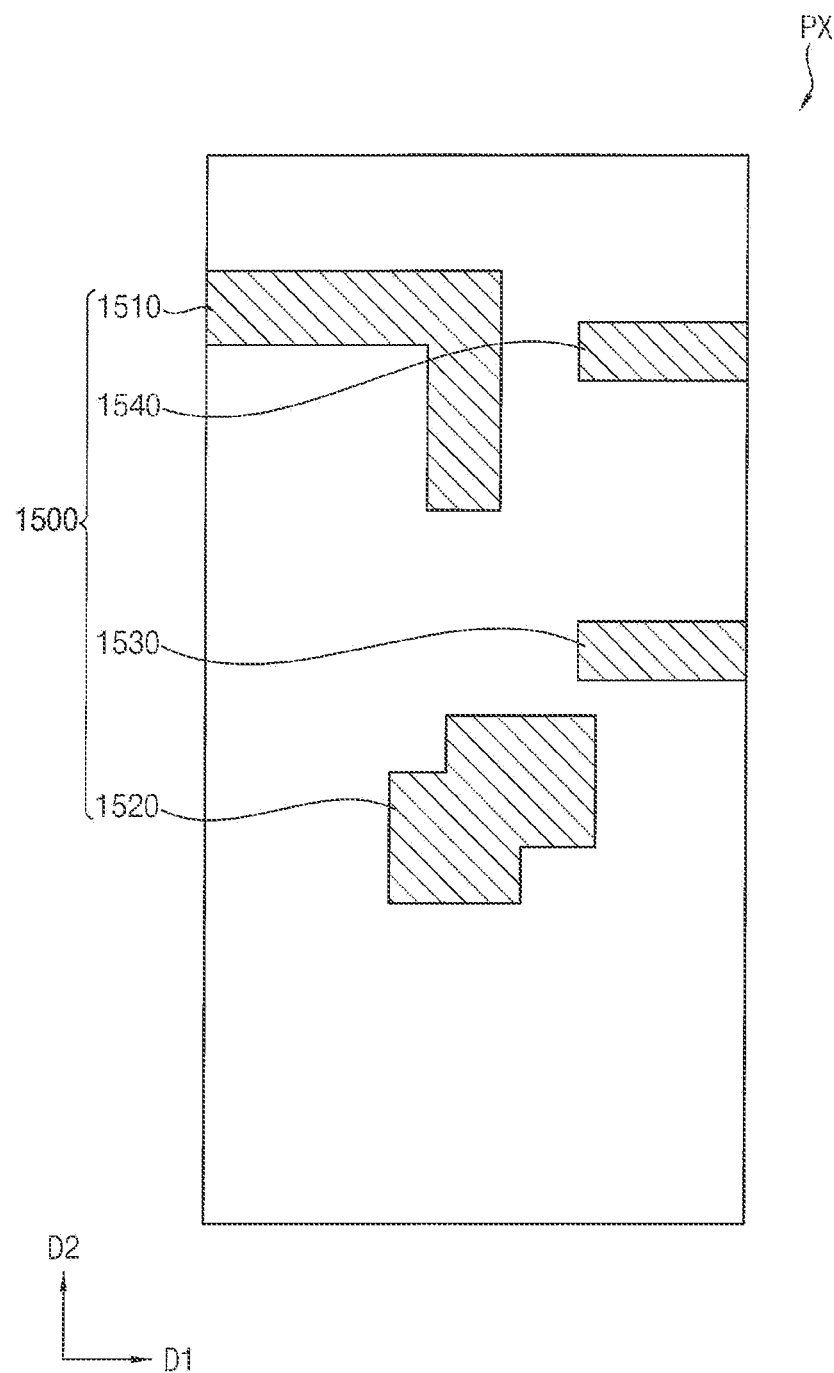
Figure 12:
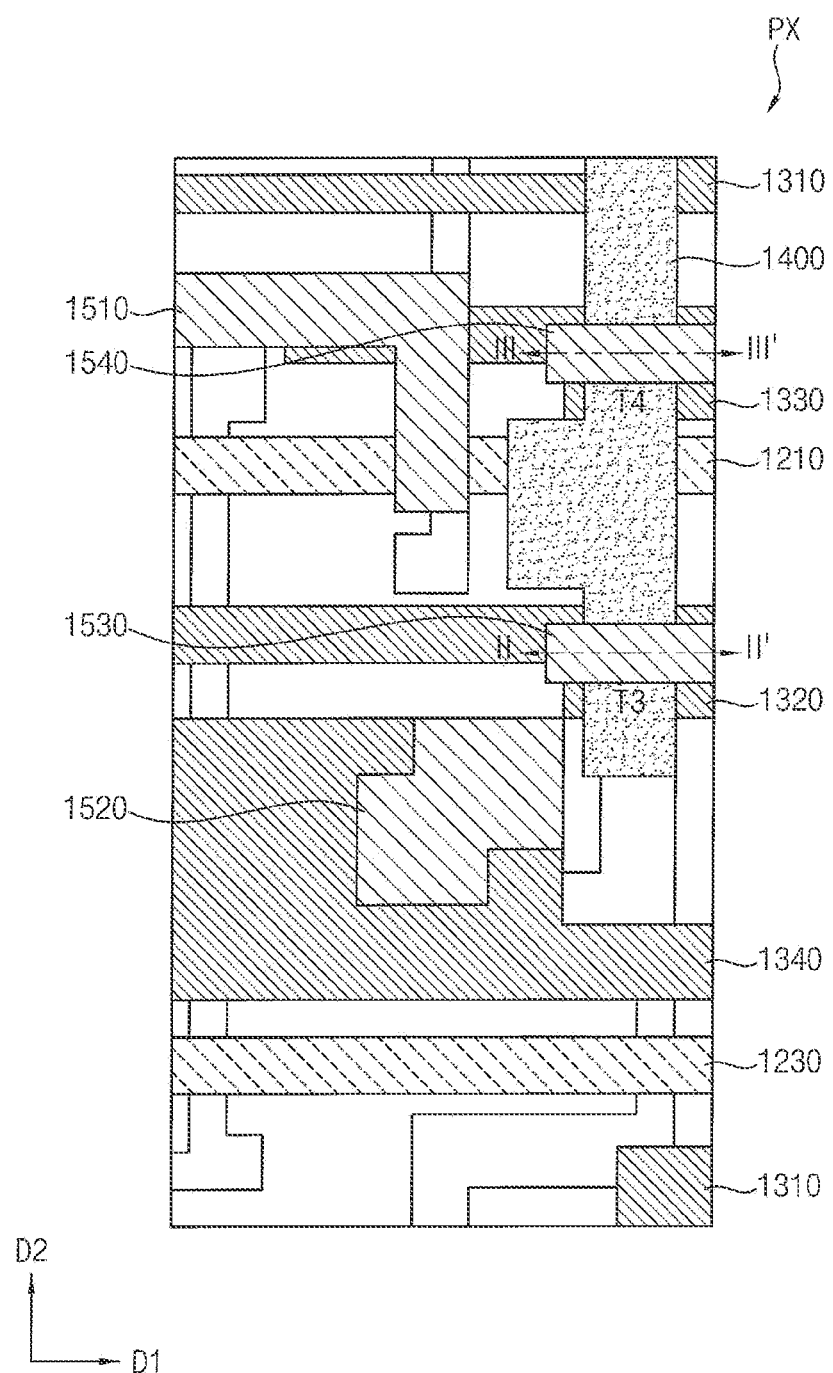

Referring to FIGS. 11 and 12, a third conductive pattern 1500 may be located on the second gate insulating layer. The third conductive pattern 1500 may include a first connecting pattern 1510, a third connecting pattern 1520, a first upper electrode 1530, and a second upper electrode 1540.

According to some example embodiments, the first connecting pattern 1510 may transmit the initialization voltage AINT to the seventh transistor T7. The first connecting pattern 1510 may transmit the initialization voltage AINT to a second connecting pattern (e.g., a second connecting pattern 1630 of FIG. 17). For example, the first connecting pattern 1510 may contact the second connecting pattern.

Figure 17:
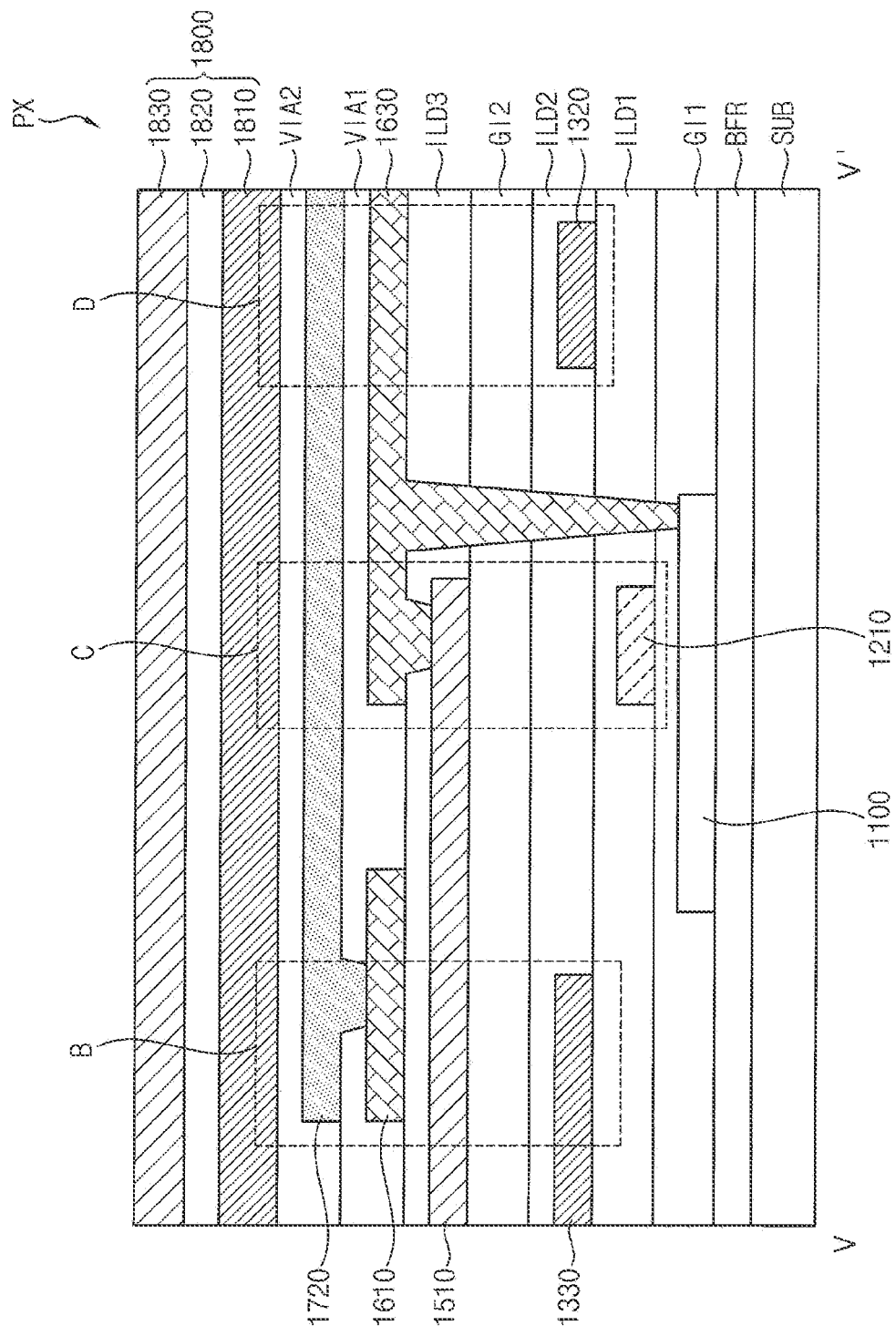
FIG. 17 is a cross-sectional view taken along the line I-I' of FIG. 16.

According to some example embodiments, the first connecting pattern 1510 may overlap the first gate line 1210, the fourth gate line 1330, and a vertical transmitting line (for example, a vertical transmitting line 1720 in FIG. 17). This will be described in more detail with reference to FIG. 17.

According to some example embodiments, the third connecting pattern 1520 may electrically connect the gate terminal of the first transistor T1 and the second terminal of the third transistor T3. The third connecting pattern 1520 may contact the gate electrode 1220 and a fourth connecting pattern (e.g., a fourth connecting pattern 1660 in FIG. 21). For example, the gate electrode 1220, the opening H of the storage capacitor electrode 1340, and the third connecting pattern 1520 may overlap each other. This will be described in more detail with reference to FIG. 21.

According to some example embodiments, the first upper electrode 1530 may transmit the second gate signal GC to the third transistor T3. The first upper electrode 1530 may contact the third gate line 1320. For example, the first upper electrode 1530 may overlap the third gate line 1320 and the second active pattern 1400. This will be described in more detail with reference to FIG. 18.

According to some example embodiments, the second upper electrode 1540 may transmit the third gate signal GI to the fourth transistor T4. The second upper electrode 1540 may contact the fourth gate line 1330. For example, the second upper electrode 1540 may overlap the fourth gate line 1330 and the second active pattern 1400.

A third interlayer insulating layer (e.g., a third interlayer insulating layer ILD3 of FIG. 17) may cover the third conductive pattern 1500 and may be located on the second gate insulating layer. The third interlayer insulating layer may include an insulating material.

Figure 13:
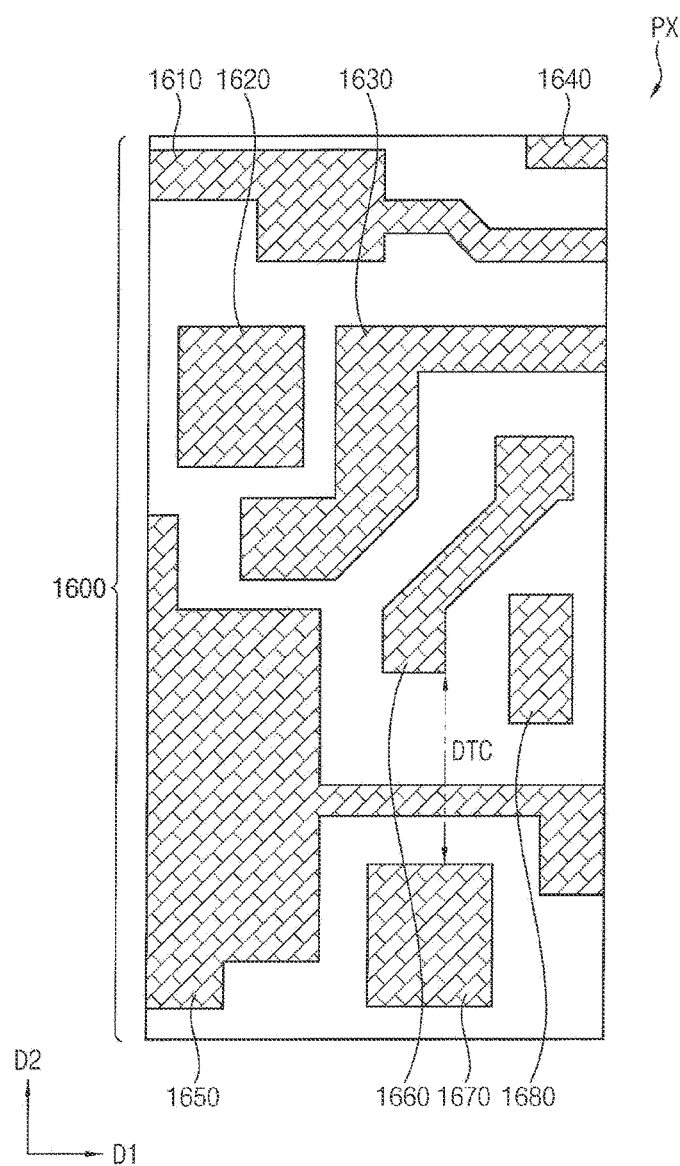
Figure 14:
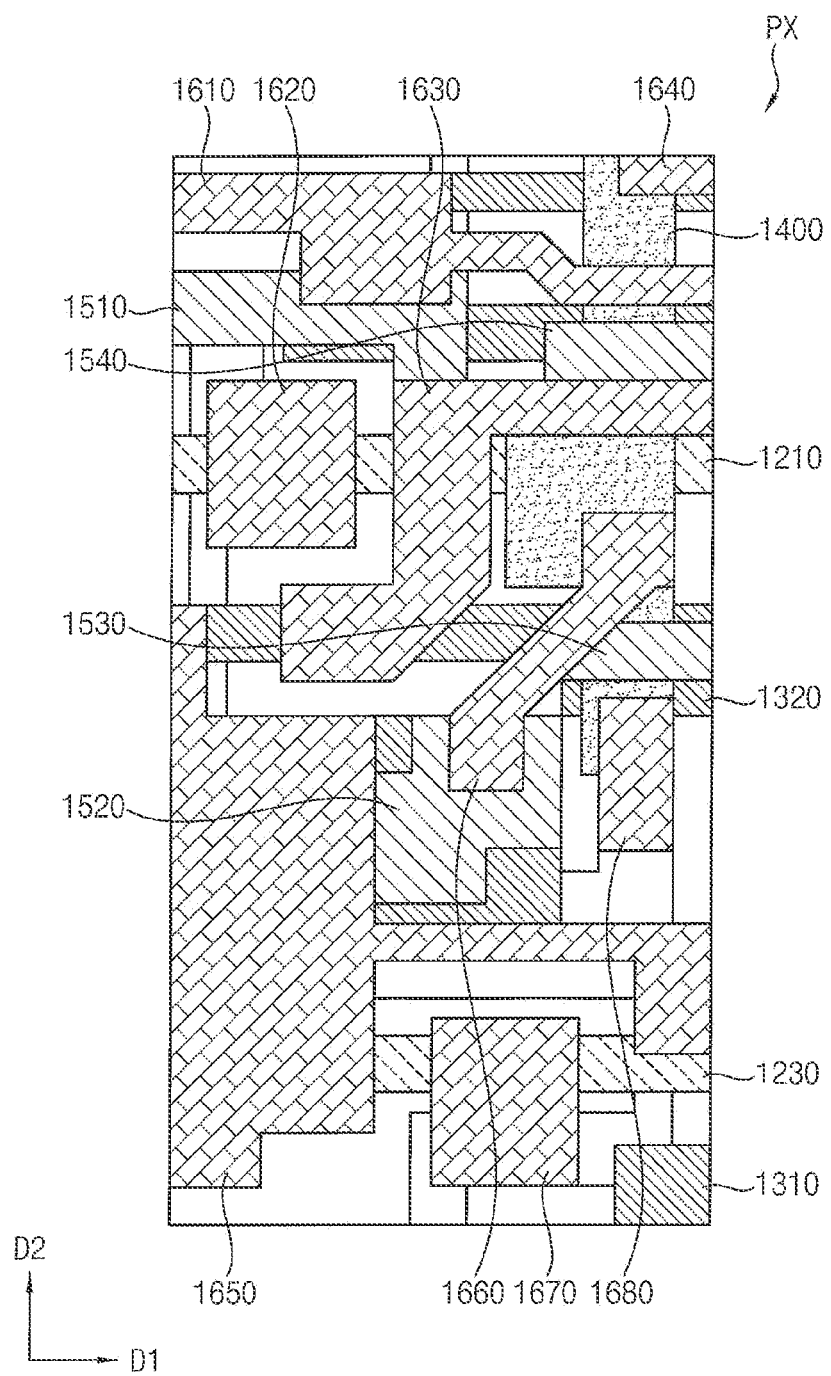

Referring to FIGS. 13 and 14, the fourth conductive pattern 1600 may be located on the third interlayer insulating layer. The fourth conductive pattern 1600 may include a horizontal transmitting line 1610, a first pad 1620, a second connecting pattern 1630, a gate initialization voltage connecting pattern 1640, a shielding pattern 1650, and a fourth connecting pattern 1660, a second pad 1670, and a compensation connecting pattern 1680.

The horizontal transmitting line 1610 may extend in the first direction D1. According to some example embodiments, the horizontal transmitting line 1610 may transmit the data voltage DATA to the second transistor T2. The horizontal transmitting line 1610 may contact a vertical transmitting line and a data line. For example, the horizontal transmitting line 1610 may correspond to the first horizontal transmitting line HFL1 or the second horizontal transmitting line HFL1 of FIG. 2.

According to some example embodiments, the horizontal transmitting line 1610 may overlap the first connecting pattern 1510. Accordingly, an area of the pixel structure PX on a plane may be reduced. In addition, the first connecting pattern 1510 may overlap the fourth gate line 1330 and the horizontal transmitting line 1610. Accordingly, the first connecting pattern 1510 may prevent or reduce a crosstalk between the fourth gate line 1330 and the horizontal transmitting line 1610.

The first pad 1620 may transmit the data voltage DATA to the first active pattern 1100. The first pad 1620 may contact the first active pattern 1100 and the data line. For example, the first pad 1620 may overlap the first active pattern 1100 and the data line.

According to some example embodiments, the second connecting pattern 1630 may transmit the initialization voltage AINT to the seventh transistor T7. For example, the second connecting pattern 1630 may transmit the initialization voltage AINT to the first active pattern 1100. The second connection pattern 1630 may contact the first active pattern 1100.

According to some example embodiments, the second connecting pattern 1630 may overlap the first gate line 1210, the third gate line 1320, and a vertical transmitting line (for example, a vertical transmitting line 1720 in FIG. 17). This will be described in more detail with reference to FIG. 17.

The gate initialization voltage connecting pattern 1640 may transmit the gate initialization voltage VINT to the fourth transistor T4. For example, the gate initialization voltage connecting pattern 1640 may transmit the gate initialization voltage VINT to the second active pattern 1400. The gate initialization voltage connecting pattern 1640 may contact the gate initialization voltage line 1310 and the second active pattern 1400.

The shielding pattern 1650 may transmit the high power voltage EVLDD to the first active pattern 1100. According to some example embodiments, the shielding pattern 1650 may electrically connect a high power voltage line (e.g., a high power voltage line 1740 of FIG. 21) and the first active pattern 1100. For example, the shielding pattern 1650 may extend in the first direction D1 and may contact the high power voltage line and the first active pattern 1100. The shielding pattern 1650 may overlap the high power voltage line and the first active pattern 1100. This will be described in more detail with reference to FIG. 21.

According to some example embodiments, the shielding pattern 1650 may overlap the vertical transmitting line and the second gate line 1230. Accordingly, the shielding pattern 1650 may prevent or reduce a crosstalk between the vertical transmitting line and the second gate line 1230. This will be described in more detail with reference to FIG. 20.

According to some example embodiments, the shielding pattern 1650 may be located between the vertical transmitting line and the third connecting pattern 1520. Accordingly, the shielding pattern 1650 may prevent or reduce a crosstalk between the vertical transmitting line and the third connecting pattern 1520. This will be described in more detail with reference to FIG. 20.

According to some example embodiments, the fourth connecting pattern 1660 may electrically connect the gate terminal of the first transistor T1 and the second terminal of the third transistor T3. The fourth connecting pattern 1660 may contact the second active pattern 1440 and the third connecting pattern 1520. For example, the fourth connecting pattern 1660 may overlap the second active pattern 1400 and the third connecting pattern 1520. This will be described in more detail with reference to FIG. 22.

The second pad 1670 may transmit the initialization voltage AINT to a first electrode (for example, a first electrode 1810 of FIG. 23). For example, the second pad 1670 may contact the first active pattern 1100 and a third pad (for example, a third pad 1730 of FIG. 23).

The compensation connecting pattern 1680 may electrically connect the second active pattern 1400 and the first active pattern 1100. For example, the first terminal of the third transistor T3 (for example, the source terminal of the third transistor T3) may be connected to the second terminal of the first transistor T1 (for example, the drain terminal of the first transistor T1) through the compensation connecting pattern 1680.

A first via insulating layer (e.g., a first via insulating layer VIA1 in FIG. 17) may cover the fourth conductive pattern 1600 and may be located on the third interlayer insulating layer. The first via insulating layer may include an organic insulating material. For example, the first via insulating layer may include a photoresist, a polyacrylic resin, a polyimide resin, an acrylic resin, or the like.

Figure 16:
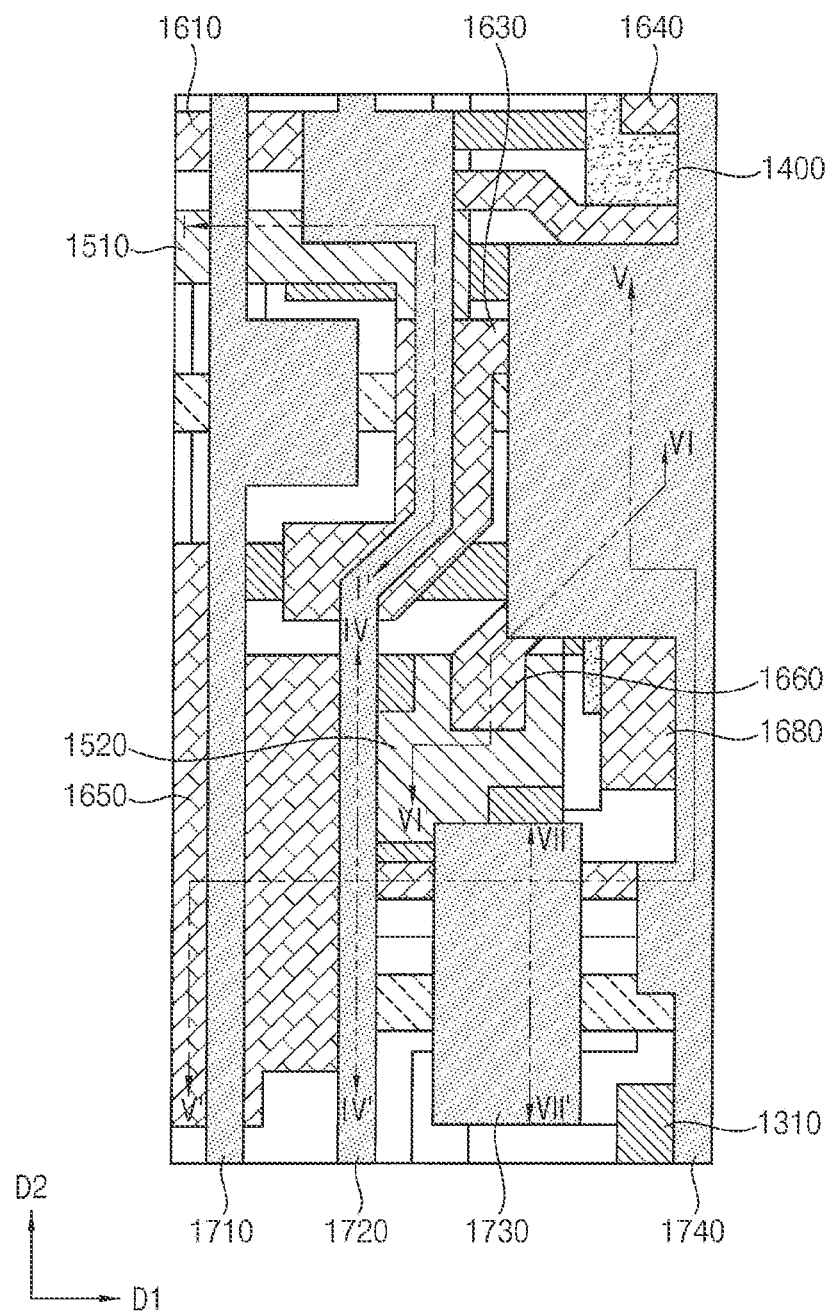

Referring to FIGS. 15 and 16, a fifth conductive pattern 1700 may be located on the first via insulating layer. The fifth conductive pattern 1700 may include a data line 1710, a vertical transmitting line 1720, a third pad 1730, and a high power voltage line 1740.

The data line 1710 may extend in the second direction D2. According to some example embodiments, the data line 1710 may transmit the data voltage DATA to the second transistor T2. For example, the data line 1710 may contact the first pad 1620.

According to some example embodiments, the data line 1710 may transmit the data voltage DATA from the data driver DDV to the first pad 1620. In this case, the data line 1710 may correspond to the third data line DL3 or the fourth data line DL4 of FIG. 2. According to some example embodiments, the data line 1710 may transmit the data voltage DATA from the horizontal transmitting line to the first pad 1620. In this case, the data line 1710 may correspond to the first data line DL1 or the second data line DL2 of FIG. 2.

The vertical transmitting line 1720 may extend in the second direction D2. According to some example embodiments, the vertical transmitting line 1720 may transmit the data voltage DATA to the second transistor T2. The vertical transmitting line 1720 may contact the horizontal transmitting line 1610. For example, the vertical transmitting line 1720 may correspond to the first vertical transmitting line VFL1 or the second vertical transmitting line VFL2 of FIG. 2.

According to some example embodiments, the fourth gate line 1330, the first connecting pattern 1510, and the vertical transmitting line 1720 may overlap each other. In addition, the first gate line 1210, the first connecting pattern 1510, the second connecting pattern 1630, and the vertical transmitting line 1720 may overlap each other. In addition, the third gate line 1320, the second connecting pattern 1630, and the vertical transmitting line 1720 may overlap each other. This will be described in more detail with reference to FIG. 17.

According to some example embodiments, the second gate line 1230, the shielding pattern 1650, and the vertical transmitting line 1720 may overlap each other. This will be described in more detail with reference to FIG. 20.

The high power voltage line 1740 may extend in the second direction D2. According to some example embodiments, the high power voltage line 1740 may transmit the high power voltage ELVDD through the shielding pattern 1650. For example, the high power voltage line 1740 may contact the shielding pattern 1650.

According to some example embodiments, the high power voltage line 1740 may overlap the second active pattern 1400. For example, the second active pattern 1400 may be the oxide semiconductor. When the oxide semiconductor is exposed to light, a leakage current may be generated through the third and fourth transistors T3 and T4 including the oxide semiconductor. For example, the light may be an external light or a light generated by the organic light emitting diode OLED. In the display device 10, because the high power voltage line 1740 overlaps the second active pattern 2400, the second active pattern 1400 may not be exposed to the light.

FIG. 17 is a cross-sectional view taken along the line I-I' of FIG. 16.

Referring to FIGS. 3, 16, and 17, the pixel structure PX may have a structure in which the substrate SUB, the buffer layer BFR, the first active pattern 1100, the first gate insulating layer GI1, the gate electrode 1220, the first interlayer insulating layer ILD1, the third gate line 1320, the storage capacitor electrode 1340, the second interlayer insulating layer ILD2, the second active pattern 1400, the second gate insulating layer GI2, the first connecting pattern 1510, the horizontal transmitting line 1610, the second connecting pattern 1630, the first via insulating layer VIA1, the vertical transmitting line 1720, the second via insulating layer VIA2, the first electrode 1810, an emission layer 1820, and a second electrode 1830 are sequentially arranged. The third gate line 1320 and the fourth gate line 1330 may be located in a same layer as each other and the horizontal transmitting line 1610 and the second connecting pattern 1630 may be located in a same layer as each other. The first electrode 1810, the emission layer 1820, and the second electrode 1830 may constitute the organic light emitting structure 1800. For example, the organic light emitting structure 1800 may correspond to the organic light emitting diode OLED described above.

According to some example embodiments, the first gate signal GW may be transmitted to the first gate line 1210, the second gate signal GC may be transmitted to the third gate line 1320, and the third gate signal GI may be transmitted to the fourth gate line 1330. Each of the first to third gate signals GW, GC, and GI may include a clock signal for turning on or turning off a transistor.

According to some example embodiments, the first connecting pattern 1510 and the second connecting pattern 1630 may transmit the initialization voltage AINT to the first active pattern 1100. For example, the second connecting pattern 1630 may contact the first connecting pattern 1510 and the first active pattern 1100. The first connecting pattern 1510 may transmit the initialization voltage AINT to the second connecting pattern 1630, and the second connecting pattern 1630 may transmit the initialization voltage AINT to the first active pattern 1100. For example, the initialization voltage AINT may be a constant voltage having a constant voltage level.

According to some example embodiments, the horizontal transmitting line 1610 and the vertical transmitting line 1720 may transmit the data voltage DATA to the data line 1710. For example, the horizontal transmitting line 1610 and the vertical transmitting line 1720 may contact each other. The vertical transmitting line 1720 may transmit the data voltage DATA to the horizontal transmitting line 1610, and the horizontal transmitting line 1610 may transmit the data voltage DATA to the data line 1710. For example, the data voltage DATA may have a variable voltage level to emit light of the organic light emitting diode OLED with a desired luminance.

A crosstalk may occur between the vertical transmitting line 1720 transmitted with the data voltage DATA and the first gate line 2210 transmitted with the first gate signal GW. Accordingly, the voltage level of the data voltage DATA may be changed by the first gate signal GW.

A crosstalk may occur between the vertical transmitting line 1720 transmitted with the data voltage DATA and the third gate line 1320 transmitted with the second gate signal GC. Accordingly, the voltage level of the data voltage DATA may be changed by the second gate signal GC.

A crosstalk may occur between the vertical transmitting line 1720 (or the horizontal transmitting line 1610) transmitted with the data voltage DATA and the fourth gate line 1330 transmitted with the third gate signal GI. Accordingly, the voltage level of the data voltage DATA may be changed by the third gate signal GI.

As the voltage level of the data voltage DATA is changed, the organic light emitting diode OLED may emit light with unwanted luminance. Accordingly, a stain may be visually recognized by the user.

The display device 10 may include the first connecting pattern 1510 and the second connecting pattern 1630 to prevent or reduce the above-described crosstalks.

According to some example embodiments, the first gate line 1210, the first connecting pattern 1510, the second connecting pattern 1630, and the vertical transmitting line 1720 may overlap each other in region C of FIG. 17. For example, the first connecting pattern 1510 and the second connecting pattern 1630 may prevent or reduce a crosstalk between the first gate line 1220 and the vertical transmitting line 1720.

According to some example embodiments, the third gate line 1320, the second connecting pattern 1630, and the vertical transmitting line 1720 may overlap each other in region D of FIG. 17. For example, the second connecting pattern 1630 may prevent or reduce a crosstalk between the third gate line 1320 and the vertical transmitting line 1720.

Figure 18:
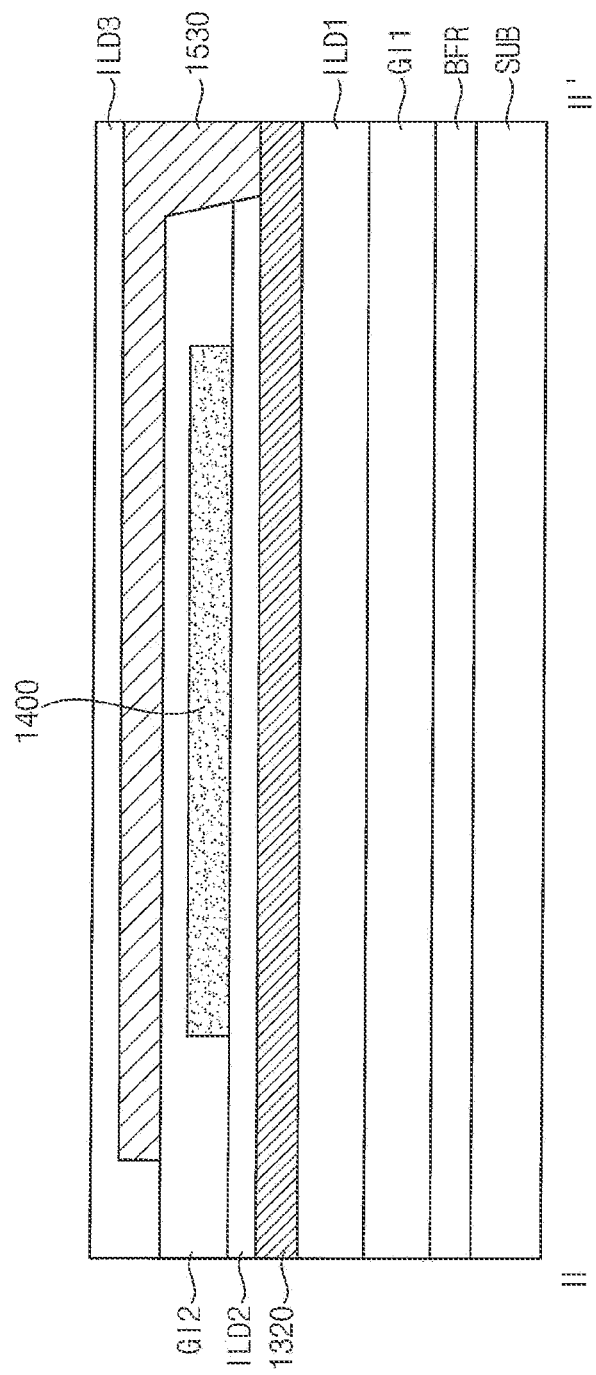
FIG. 18 is a cross-sectional view taken along the line II-II' of FIG. 12.

According to some example embodiments, the fourth gate line 1330, the first connecting pattern 1510, the horizontal transmitting line 1610, and the vertical transmitting line 1720 may overlap each other in region B of FIG. 17. For example, the first connecting pattern 1510 may prevent or reduce a crosstalk between the fourth gate line 1330 and the horizontal transmitting line 1610, and may prevent or reduce a crosstalk between the fourth gate line 1330 and the vertical transmitting line 1720. FIG. 18 is a cross-sectional view taken along the line II-11' of FIG. 12.

Referring to FIGS. 3, 12, and 18, the pixel structure PX may have a structure in which the substrate SUB, the buffer layer BFR, the first gate insulating layer GI1, the first interlayer insulating layer ILD1, the third gate line 1320, the second interlayer insulating layer ILD2, the second active pattern 1400, the second gate insulating layer GI2, the first upper electrode 1530, and the third interlayer insulating layer ILD3 are sequentially arranged.

According to some example embodiments, the third gate line 1320 may be located under the second active pattern 1400, and the first upper electrode 1530 may be located on the second active pattern 1400. In addition, the third gate line 1320, the second active pattern 1400, and the first upper electrode 1530 may overlap each other.

According to some example embodiments, the second gate signal GC may be transmitted to the third gate line 2320. In addition, the first upper electrode 1530 may contact the third gate line 1320. Accordingly, the second gate signal GC may also be transmitted to the first upper electrode 1530. Therefore, a turn-on characteristic and/or a turn-off characteristic of the third transistor T3 may be improved.

Figure 19:
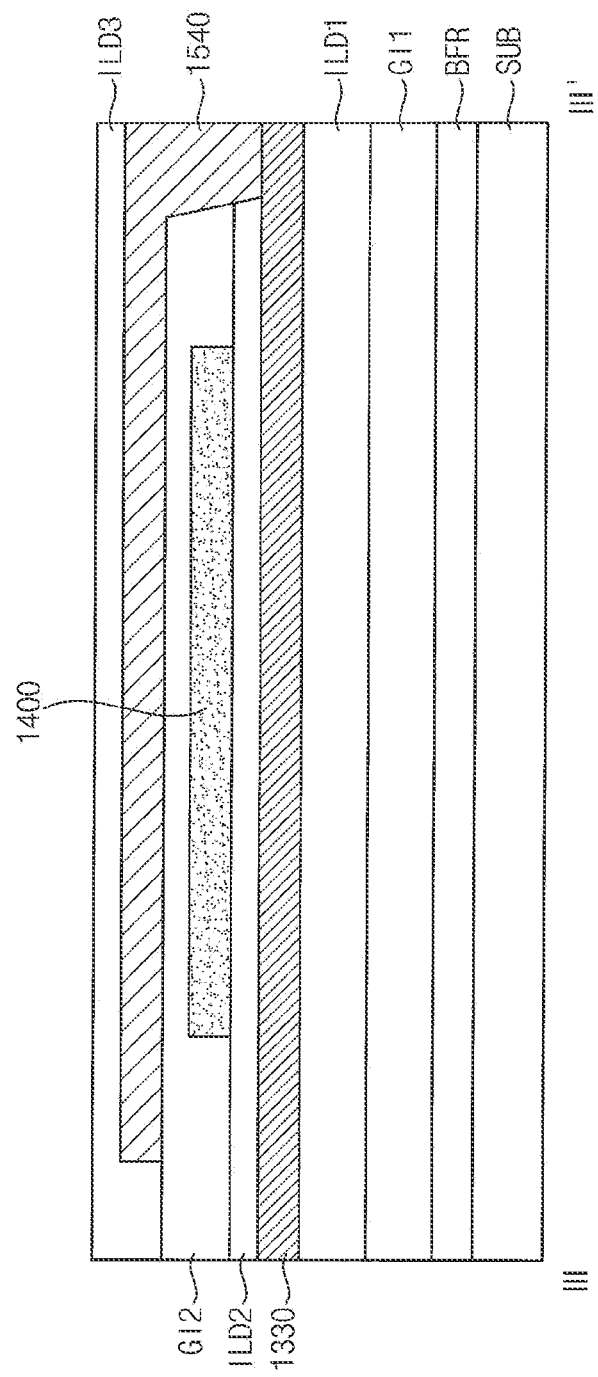
FIG. 19 is a cross-sectional view taken along the line III-III' of FIG. 12.

FIG. 19 is a cross-sectional view taken along the line III-III' of FIG. 12.

Referring to FIGS. 3, 12, and 19, the pixel structure PX may have a structure in which the substrate SUB, the buffer layer BFR, the first gate insulating layer GI1, the first interlayer insulating layer ILD1, the fourth gate line 1330, the second interlayer insulating layer ILD2, the second active pattern 1400, the second gate insulating layer GI2, the second upper electrode 1540, and the third interlayer insulating layer ILD3 are sequentially arranged.

According to some example embodiments, the fourth gate line 1330 may be located under the second active pattern 1400, and the second upper electrode 1540 may be located on the second active pattern 1400. In addition, the fourth gate line 1330, the second active pattern 1400, and the second upper electrode 1540 may overlap each other.

According to some example embodiments, the third gate signal GI may be transmitted to the fourth gate line 1330. In addition, the second upper electrode 1540 may contact the fourth gate line 1330. Accordingly, the second gate signal GC may also be transmitted to the second upper electrode 1540. Therefore, a turn-on characteristic and/or a turn-off characteristic of the fourth transistor T4 may be improved.

Figure 20:
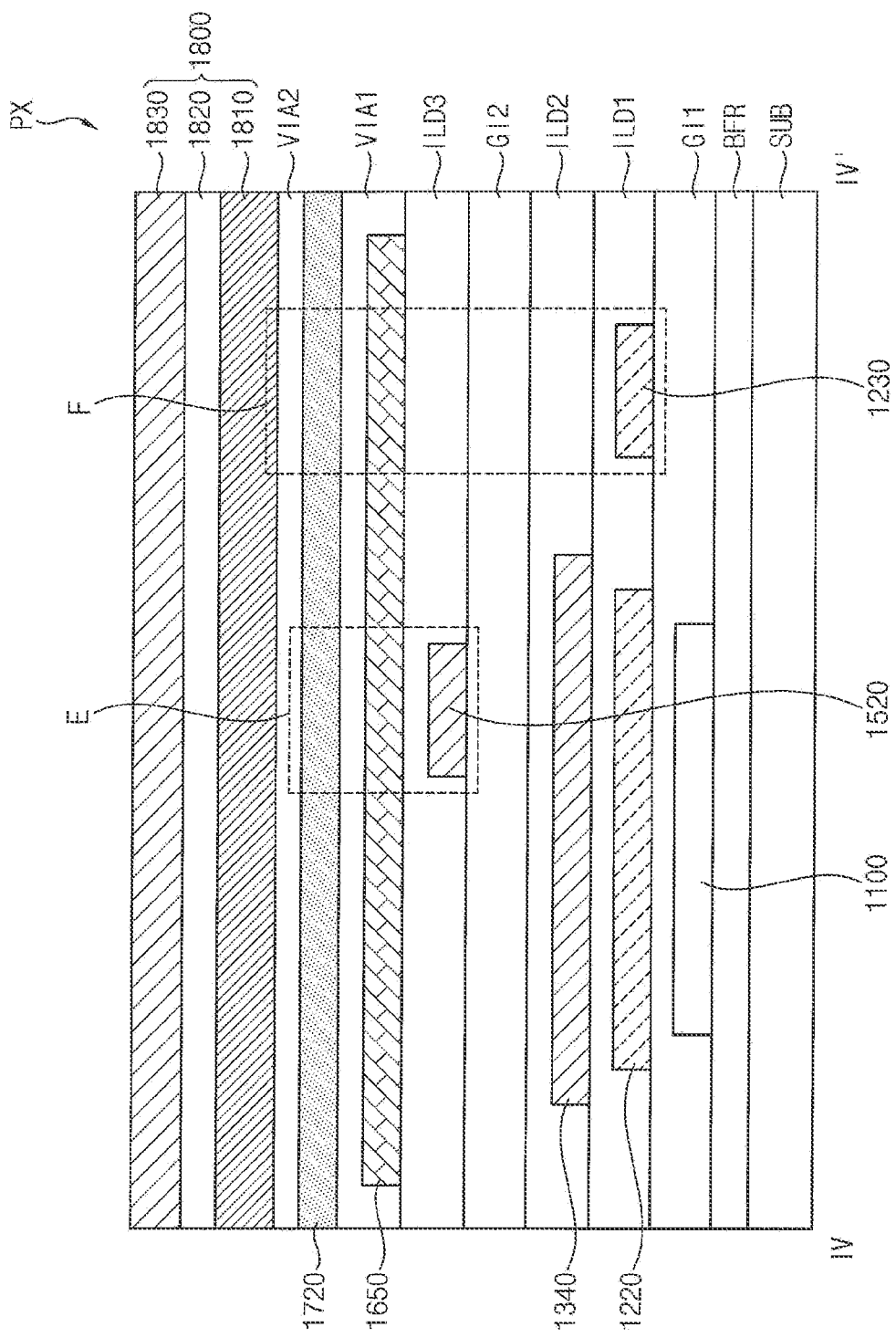
FIG. 20 is a cross-sectional view taken along the line IV-IV' of FIG. 16.

FIG. 20 is a cross-sectional view taken along the line IV-IV' of FIG. 16.

Referring to FIGS. 3, 16, and 20, the pixel structure PX may have a structure in which the substrate SUB, the buffer layer BFR, the first active pattern 1100, the first gate insulating layer GI1, the gate electrode 1220, the second gate line 1230, and the first interlayer insulating layer ILD1, the storage capacitor electrode 1340, the second interlayer insulating layer ILD2, the second gate insulating layer GI2, the third connecting pattern 1520, the third interlayer insulating layer ILD3, the shielding pattern 1650, the first via insulating layer VIA1, the vertical transmitting line 1720, the second via insulating layer VIA2, the first electrode 1810, the emission layer 1820, and the second electrode 1830 are sequentially arranged. The gate electrode 1220 and the second gate line 1230 may be located in a same layer.

For example, the third connecting pattern 1520 may electrically connect the gate terminal of the first transistor T1 and the second terminal of the third transistor T3. The high power voltage ELVDD may be transmitted to the shielding pattern 1650. The vertical transmitting line 1720 may transmit the data voltage DATA to the data line 1710. The emission management signal EM may be transmitted to the second gate line 1230. The emission management signal EM may include a clock signal for turning on or off a transistor.

A crosstalk may occur between the vertical transmitting line 1720 transmitted with the data voltage DATA and the third connecting pattern 1520. Accordingly, the voltage level of the data voltage DATA may be changed.

A crosstalk between the vertical transmitting line 1720 transmitted with the data voltage DATA and the second gate line 1230 transmitted with the emission management signal EM. Accordingly, the voltage level of the data voltage DATA may be changed by the emission management signal EM.

As the voltage level of the data voltage DATA is changed, the organic light emitting diode OLED may emit light with unwanted luminance. Accordingly, a stain may be visually recognized by the user.

However, the display device 10 may include the shielding pattern 1650 to prevent or reduce the above-described crosstalks.

According to some example embodiments, the third connecting pattern 1520, the shielding pattern 1650, and the vertical transmitting line 1720 may overlap each other in region E of FIG. 20. For example, the shielding pattern 1650 may prevent or reduce a crosstalk between the third gate pattern 1520 and the vertical transmitting line 1720.

According to some example embodiments, the second gate line 1230, the shielding pattern 1650, and the vertical transmitting line 1720 may overlap each other in region F of FIG. 20. For example, the shielding pattern 1650 may prevent or reduce a crosstalk between the second gate line 1230 and the vertical transmitting line 1720.

Figure 21:
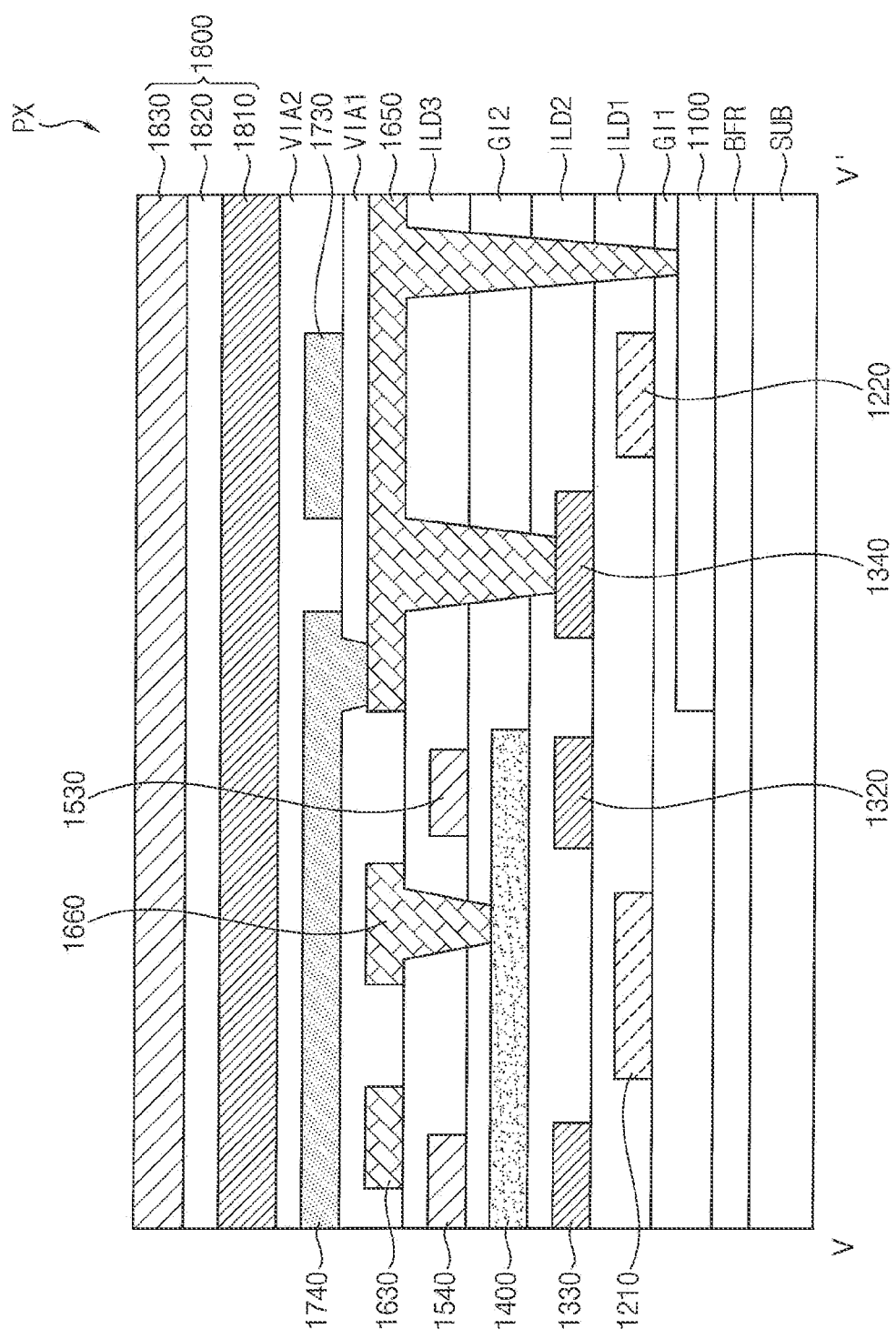
FIG. 21 is a cross-sectional view taken along the line V-V' of FIG. 16.

FIG. 21 is a cross-sectional view taken along the line V-V' of FIG. 16.

Referring to FIGS. 3, 16, and 21, the pixel structure PX may have a structure in which the substrate SUB, the buffer layer BFR, the first active pattern 1100, the first gate insulating layer GI1, the first gate line 1210, the gate electrode 1220, the third gate line 1320, the fourth gate line 1330, the storage capacitor electrode 1340, the second active pattern 1400, the first upper electrode 1530, the second upper electrode 1540, the second connecting pattern 1630, the shielding pattern 1650, the fourth connecting pattern 1660, the first via insulating layer VIA1, the third pad 1730, the high power voltage line 1740, the second via insulating layer VIA2, the first electrode 1810, the emission layer 1820, and the second electrode 1830 are sequentially arranged. The first gate line 1210 and the gate electrode 1220 may be located in a same layer as each other, and the third gate line 1320, the fourth gate line 1330, and the storage capacitor electrode 1340 may be located in a same layer as each other. The first upper electrode 1530 and the second upper electrode 1540 may be located in a same layer as each other, the second connecting pattern 1630, the shielding pattern 1650, and the fourth connecting pattern 1660 may be located in a same layer as each other, and the third pad 1730 and the high power voltage line 1740 may be located in a same layer as each other.

According to some example embodiments, the high power voltage line 1740 may transmit the high power voltage ELVDD to the first active pattern 1100. For example, the high power voltage line 1740 may contact the shielding pattern 1650, and the shielding pattern 1650 may contact the first active pattern 1100. The high power voltage ELVDD may be transmitted to the high power voltage line 1740, the shielding pattern 1650, and the first active pattern 1100.

According to some example embodiments, the high power voltage line 1740 may overlap the second active pattern 1400. For example, the second active pattern 1400 may be the oxide semiconductor. When the oxide semiconductor is exposed to light, a leakage current may be generated through the third and fourth transistors T3 and T4 including the oxide semiconductor. For example, the light may be an external light or a light generated by the organic light emitting diode OLED. Because the high power voltage line 1740 overlaps the second active pattern 1400, the second active pattern 1400 may not be exposed to the light.

FIG. 22 is a cross-sectional view taken along the line VI-VI' of FIG. 16.

Referring to FIGS. 3, 16, and 22, the pixel structure PX may have a structure in which the substrate SUB, the buffer layer BFR, the first active pattern 1100, the first gate insulating layer GI1, the gate electrode 1220, the first interlayer insulating layer ILD1, the third gate line 1320, the storage capacitor electrode 1340, the second interlayer insulating layer ILD2, the second active pattern 1400, the second gate insulating layer GI2, the third connecting pattern 1520, the third interlayer insulating layer ILD3, the fourth connecting pattern 1660, the first via insulating layer VIA1, the high power voltage line 1740, the second via insulating layer VIA2, the first electrode 1810, the emission layer 1820, and the second electrode 1830 are sequentially arranged. The third gate line 2320 and the storage capacitor electrode 2340 may be located in a same layer.

According to some example embodiments, the third connecting pattern 1520 and the fourth connecting pattern 1660 may be configured to connect the gate terminal of the first transistor T1 and the second terminal of the third transistor T3. For example, the third connecting pattern 1520 may contact the gate electrode 1220, and the fourth connecting pattern 1660 may contact the third connection pattern 1520 and the second active pattern 1400.

According to some example embodiments, the gate electrode 1220, the opening H of the storage capacitor electrode 1340, and the third connecting pattern 1520 may overlap each other. According to some example embodiments, the second active pattern 1400 and the fourth connecting pattern 1660 may overlap each other.

Because the display device 10 includes the third connecting pattern 1520 and the fourth connecting pattern 1660, the area of the pixel structure PX on a plane may be reduced. Accordingly, the resolution of the display device 10 may be increased.

For example, a predetermined distance (e.g., a predetermined distance DTC of FIG. 13) may be required between the fourth connecting pattern 1660 and the second pad 1670. Because the third connecting pattern 1520 is located under the fourth connecting pattern 1660, the fourth connecting pattern 1660 may not be located in a region (e.g. a region G of FIG. 2) where the third connection pattern 1520 is located. Accordingly, the second pad 1670 spaced apart from the fourth connecting pattern 1660 by the predetermined distance DTC may be located adjacent to the second direction D2. Therefore, the area of the pixel structure PX on a plane may be reduced.

FIG. 23 is a cross-sectional view taken along the line VII-VII' of FIG. 16.

Referring to FIGS. 3, 16, and 23, the pixel structure PX may have a structure in which the substrate SUB, the buffer layer BFR, the first active pattern 1100, the first gate insulating layer GI1, the gate electrode 1220, the second gate line 1230, the first interlayer insulating layer ILD1, the storage capacitor electrode 1340, the second interlayer insulating layer ILD2, the second gate insulating layer GI2, the third interlayer insulating layer ILD3, the second pad 1670, the first via insulating layer VIA1, the third pad 1730, the second via insulating layer VIA2, the first electrode 1810, the emission layer 1820, and the second electrode 1830 are sequentially arranged. The gate electrode 1220 and the second gate line 1230 may be located in a same layer as each other.

According to some example embodiments, the first electrode 1810 may be electrically connected to the first active pattern 1100. For example, the first electrode 1810 may be transmitted with the driving current from the first active pattern 1100. The emission layer 1820 may emit light through the driving current. In addition, the first electrode 1810 may be transmitted with the initialization voltage AINT from the first active pattern 1100. The first electrode 1810 may be initialized to the initialization voltage AINT. The first active pattern 1100 may contact the second pad 1670, the second pad 1670 may contact the third pad 1730, and the third pad 1730 may contact the first electrode 1810.

Because the display device 10 includes the first and second connecting patterns 1510 and 1630, a crosstalk between the gate lines (e.g., the first gate line 1210, the third gate line 1320, and the fourth gate line 1330) and the transmitting lines (e.g., the horizontal transmitting line 1610 and the vertical transmitting line 1720) may be prevented or reduced. Accordingly, display quality of the display device 10 may be improved.

In addition, because the display device 10 includes the shielding pattern 1650, a crosstalk between the second gate line 1230 and the transmitting lines may be prevented or reduced, and a crosstalk between the third connecting pattern 1520 and the transmitting lines may be prevented or reduced. Accordingly, display quality of the display device 10 may be improved.

In addition, because the display device 10 includes the third connecting pattern 1520 and the fourth connecting pattern 1660, the area of the pixel structure PX on a plane may be reduced. In addition, because the display device 10 includes the first and second upper electrodes 1530 and 1540, turn-on characteristics and/or turn-off characteristics of transistors may be improved.

Although aspects of certain example embodiments and implementations have been described herein, other embodiments and modifications will be apparent from this description. Accordingly, embodiments according to the inventive concepts are not limited to such embodiments, but rather to the broader scope of the appended claims and their equivalents, and various obvious modifications and equivalent arrangements as would be apparent to a person of ordinary skill in the art.

What is claimed is:

1. A display device comprising a plurality of pixel structures, each of the plurality of the pixel structures comprising:
    a first active pattern located on a substrate and comprising a silicon semiconductor;
    a first gate line on the first active pattern;
    a gate initialization voltage line located on the first active pattern and configured to transmit a gate initialization voltage;
    a second active pattern located on the first gate line, comprising an oxide semiconductor, and electrically connected to the gate initialization voltage line;
    a first connecting line located on the second active pattern and configured to transmit an initialization voltage; and
    a second connecting line located on the first connecting line and electrically connecting the first active pattern and the first connecting line.

2. The display device of claim 1, wherein the first connecting line and the second connecting line are configured to transmit the initialization voltage to the first active pattern.

3. The display device of claim 1, wherein the second connecting line contacts the first active pattern and the first connecting line.

4. The display device of claim 1, wherein the gate initialization voltage line is configured to transmit the gate initialization voltage to the second active pattern.

5. The display device of claim 1, further comprising:
    a gate initialization voltage connecting pattern located on the second active pattern and contacting the gate initialization voltage line and the second active pattern.

6. The display device of claim 1, further comprising:
    a gate electrode on the first active pattern; and
    a third connecting electrode located on the second active pattern and contacting the gate electrode and the second active pattern,
    wherein the gate initialization voltage line is configured to transmit the gate initialization voltage to the gate electrode through the second active pattern and the fourth third connecting electrode.

7. The display device of claim 6, further comprising:
    a first upper electrode on the second active pattern,
    wherein the first active pattern and the gate electrode constitute a first transistor which is a silicon-based semiconductor element, and
    wherein the second active pattern and the first upper electrode constitute a third transistor which is an oxide-based semiconductor element.

8. The display device of claim 7, further comprising:
    a first upper line on the second active pattern; and
    a compensation connecting pattern contacting the first active pattern and the second active pattern,
    wherein the second active pattern and the first upper line constitute a third transistor which is an oxide-based semiconductor element, and
    the first transistor is electrically connected to the third transistor through the compensation connecting pattern.

9. The display device of claim 6, wherein the first gate line and the second active pattern constitute a boosting capacitor, and
    wherein the second active pattern is electrically connected to the gate electrode.

10. The display device of claim 6, further comprising:
    a shielding pattern configured to transmit a high power voltage, contacting the first active pattern, and overlapping the gate electrode.

11. The display device of claim 1, wherein at least one of the first connecting line or the second connecting line overlaps the first gate line.

* * * * *